United States Patent
Yen

(10) Patent No.: US 9,543,165 B2
(45) Date of Patent: Jan. 10, 2017

(54) METHOD OF FABRICATING SEMICONDUCTOR DEVICE

(71) Applicant: Taiwan Semiconductor Manufacturing Company, Ltd., Hsin-Chu (TW)

(72) Inventor: Yung-Sung Yen, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/621,563

(22) Filed: Feb. 13, 2015

(65) Prior Publication Data
US 2016/0240387 A1    Aug. 18, 2016

(51) Int. Cl.
*H01L 21/311*    (2006.01)
*H01L 23/31*    (2006.01)

(52) U.S. Cl.
CPC .... *H01L 21/31116* (2013.01); *H01L 21/31144* (2013.01); *H01L 23/3171* (2013.01)

(58) Field of Classification Search
CPC .. H01L 21/31; H01L 21/311; H01L 21/31116; H01L 21/31144; H01L 21/76802; H01L 21/76816; H01L 21/469; H01L 21/31053; H01L 21/31055; H01L 21/31056; H01L 21/47573; H01L 21/027; H01L 21/0332; H01L 21/475
See application file for complete search history.

(56) References Cited

U.S. PATENT DOCUMENTS

| | | | | |
|---|---|---|---|---|
| 5,888,678 | A * | 3/1999 | Tzu | G03F 1/29 430/5 |
| 6,204,187 | B1 * | 3/2001 | Rupp | H01L 21/31144 257/E21.257 |
| 8,216,767 | B2 | 7/2012 | Wang et al. | |
| 8,323,870 | B2 | 12/2012 | Lee et al. | |
| 8,580,117 | B2 | 11/2013 | Kao et al. | |
| 8,658,344 | B2 | 2/2014 | Wang et al. | |

(Continued)

FOREIGN PATENT DOCUMENTS

JP    2011258728    12/2011
KR    20090110612    10/2009

OTHER PUBLICATIONS

Korean Office Action issued in Patent Application No. 10-2014-0165318 filed Nov. 25, 2014.

*Primary Examiner* — Khiem D Nguyen
*Assistant Examiner* — Pauline Vu
(74) *Attorney, Agent, or Firm* — Haynes and Boone, LLP

(57) ABSTRACT

A method for fabricating a semiconductor device includes forming a first hard mask (HM) layer over a material layer, forming a patterned second HM layer over the first HM layer. The patterned second HM layer has first trench extending along a first direction. The method also includes forming a patterned resist layer over the second HM layer. The patterned resist layer has a first line opening extending along a second direction, which is perpendicular to the first direction. The first line opening overlaps the first trench and exposes a portion of the second HM layer. The method also includes etching the first HM layer by using the patterned resist layer and the exposed portion of the second HM layer as an etch mask together to form a first hole feature in the first HM layer.

19 Claims, 19 Drawing Sheets

(56) References Cited

U.S. PATENT DOCUMENTS

| | | | |
|---|---|---|---|
| 8,697,538 B1* | 4/2014 | Chiang | H01L 21/0338 257/E21.246 |
| 8,715,919 B2 | 5/2014 | Chang et al. | |
| 8,741,551 B2 | 6/2014 | Wu et al. | |
| 9,240,346 B2* | 1/2016 | Lee | H01L 21/76816 |
| 2005/0048785 A1* | 3/2005 | Kang | H01L 21/31116 438/696 |
| 2006/0110941 A1* | 5/2006 | Yen | H01L 21/312 438/781 |
| 2007/0048674 A1* | 3/2007 | Wells | H01L 27/101 430/313 |
| 2008/0032508 A1* | 2/2008 | Chang | G03F 7/0035 438/725 |
| 2008/0081461 A1* | 4/2008 | Lee | H01L 21/0337 438/637 |
| 2008/0113511 A1* | 5/2008 | Park | H01L 21/0337 438/692 |
| 2008/0124931 A1* | 5/2008 | Lee | H01L 21/0332 438/692 |
| 2008/0248429 A1* | 10/2008 | Chou | G03F 1/144 430/311 |
| 2009/0115064 A1* | 5/2009 | Sandhu | H01L 21/0337 257/773 |
| 2009/0146148 A1 | 6/2009 | Pyo | |
| 2009/0206475 A1* | 8/2009 | Konishi | H01L 21/31116 257/734 |
| 2010/0041235 A1* | 2/2010 | Hashimoto | H01L 21/0332 438/703 |
| 2010/0167502 A1* | 7/2010 | Yen | H01L 21/0337 438/478 |
| 2010/0244173 A1 | 9/2010 | Wang et al. | |
| 2010/0248491 A1* | 9/2010 | Sun | H01L 21/0338 438/717 |
| 2011/0008968 A1* | 1/2011 | Chang | H01L 21/76807 438/703 |
| 2011/0070738 A1* | 3/2011 | Liang | H01L 21/76808 438/702 |
| 2011/0195576 A1* | 8/2011 | Ko | H01L 21/31144 438/702 |
| 2011/0298074 A1 | 12/2011 | Funao | |
| 2012/0040528 A1* | 2/2012 | Kim | H01L 21/76816 438/675 |
| 2012/0147674 A1* | 6/2012 | Park | G11C 5/063 365/185.05 |
| 2012/0156593 A1* | 6/2012 | Hsieh | G03F 1/144 430/5 |
| 2013/0109148 A1* | 5/2013 | Oh | H01L 21/76816 438/382 |
| 2013/0157441 A1* | 6/2013 | Han | H01L 21/02532 438/478 |
| 2013/0178067 A1* | 7/2013 | Yu | H01L 21/0337 438/699 |
| 2013/0249040 A1 | 9/2013 | Liu et al. | |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065823 A1* | 3/2014 | Sipani | H01L 21/76802 438/675 |
| 2014/0065843 A1 | 3/2014 | Chang et al. | |
| 2014/0110862 A1* | 4/2014 | Jeng | H01L 21/76898 257/774 |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0193974 A1* | 7/2014 | Lee | H01L 21/76816 438/669 |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2015/0325454 A1* | 11/2015 | Maekawa | H01L 21/31116 438/466 |

* cited by examiner

METHOD OF FABRICATING SEMICONDUCTOR DEVICE

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process has decreased. When a semiconductor device is scaled down through various technology nodes, challenges rise, such as reducing irregularities/distortions in features/patterns formed over a wafer and providing flexibility of forming features/patterns with various densities from an area to another area over a wafer.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
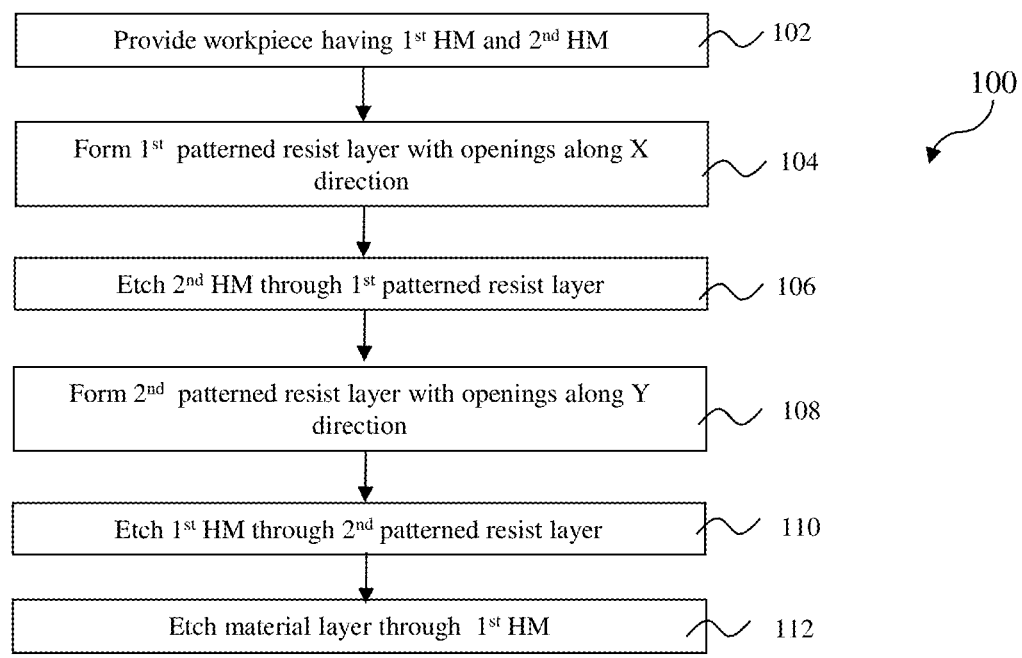
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a workpiece 205 of a semiconductor device 200 shown in FIG. 2 and the semiconductor device 200, shown in FIGS. 4A to 9C.

Figure 2:
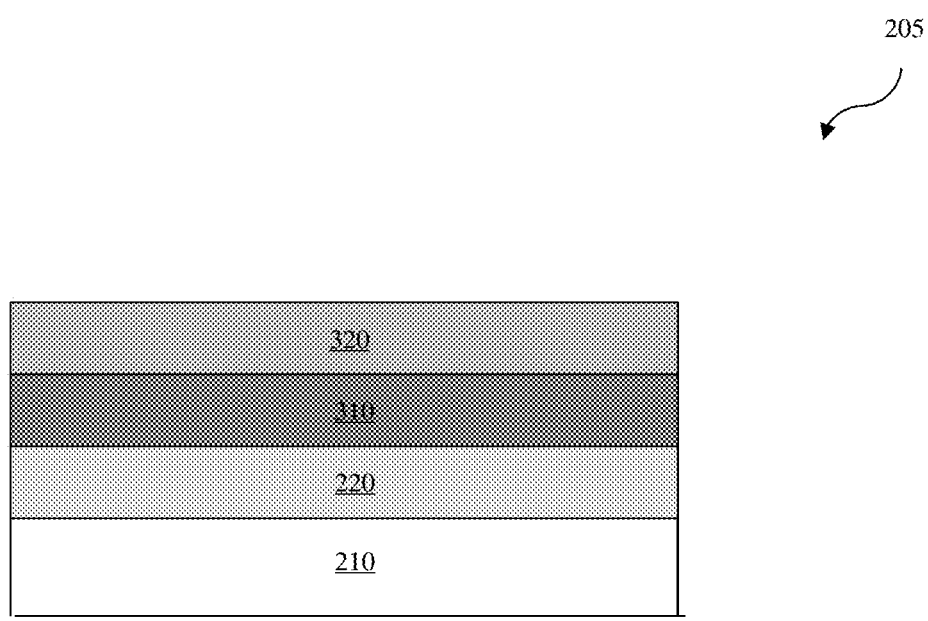
FIG. 2 is a cross section view of an example of a workpiece of a semiconductor device in accordance with some embodiments.

Referring to FIGS. 1 and 2, the method 100 starts at step 102 by receiving a workpiece 205 of the semiconductor device 200. The workpiece 205 includes a substrate 210. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various p-type doped regions and/or n-type doped regions, implemented by a process such as ion implantation and/or diffusion. Those doped regions include n-well, p-well, light doped region (LDD), doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit.

In the present embodiment, the workpiece 205 includes a material layer 220 over the substrate 210, a first hard mask (HM) layer 310 deposited over the material layer 220 and a second HM layer 320. The material layer 220 may include a dielectric layer, such as silicon oxide, silicon nitride, or silicon oxynitride, low-k dielectric material, or other suitable materials. The first and second HM layers, 310 and 320, may include silicon oxide, silicon nitride, oxynitride, silicon carbide, titanium oxide, titanium nitride, tantalum oxide, tantalum nitride, and/or any suitable materials. In the present embodiment, the first HM layer 310 may include a material which is different from the material layer 220 to achieve etching selectivity during subsequent etch processes. And the second HM layer 320 may include a material which is different from the first HM layer 310 and the material layer 220 to achieve etching selectivity during subsequent etch processes. The material layer 220 and the first and second HM layers, 310 and 320, may be deposited over the substrate 210 by suitable techniques, such as chemical vapor deposition (CVD), atomic layer deposition (ALD), physical vapor deposition (PVD), thermal oxidation, combinations thereof, or other suitable techniques.

Figure 3A:
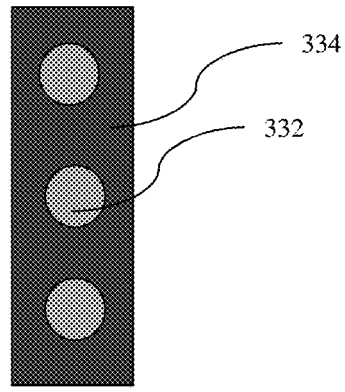
FIGS. 3A and 3B are schematic views of patterns formed over a resist layer by a lithography process.
Figure 3B:
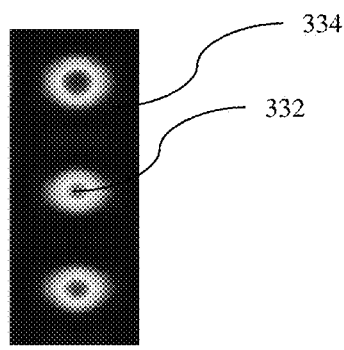
Figure 4A:
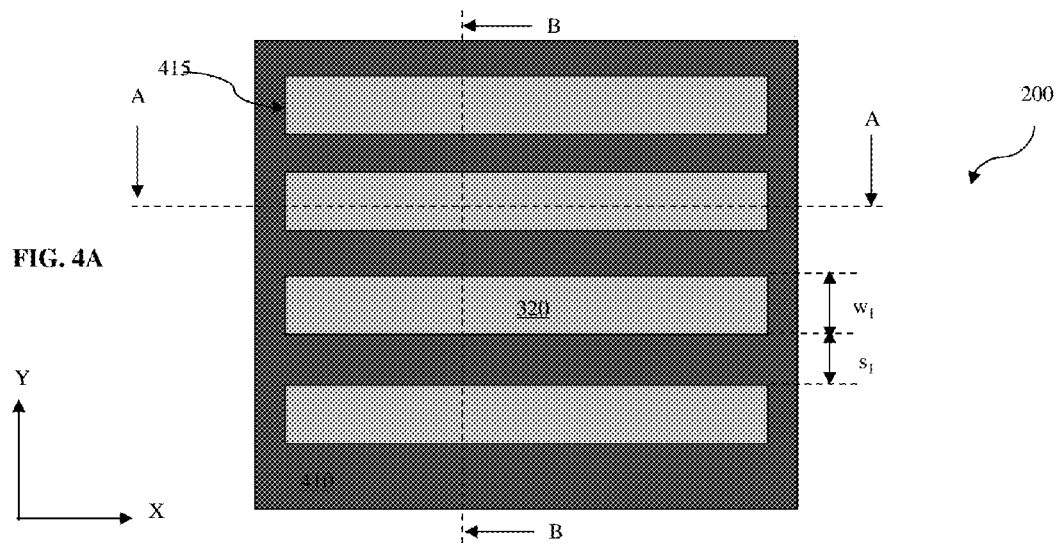
FIG. 4A is a top view of an example of a semiconductor device in accordance with some embodiments.
Figure 4B:
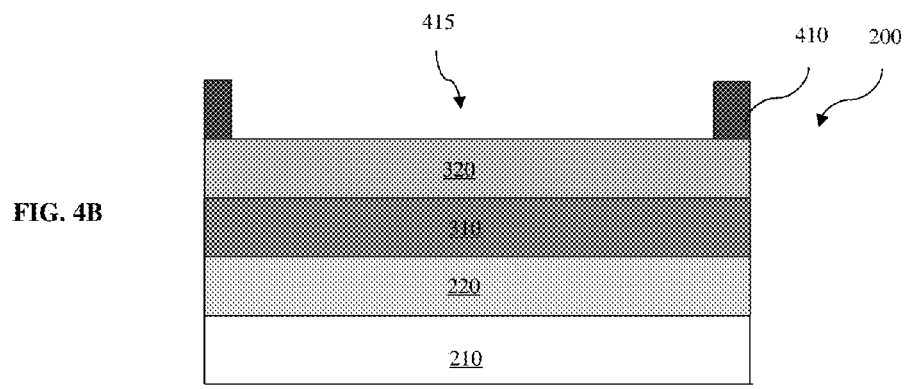
FIG. 4B is a cross-sectional view of an example semiconductor device in accordance with some embodiments, along the line A-A in FIG. 4A.
Figure 4C:
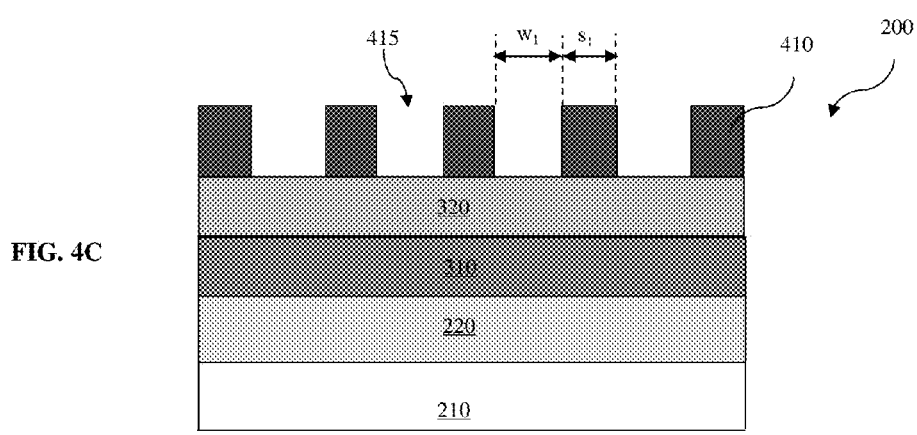
FIG. 4C is a cross-sectional view of an example semiconductor device in accordance with some embodiments, along the line B-B in FIG. 4A.
Figure 5A:
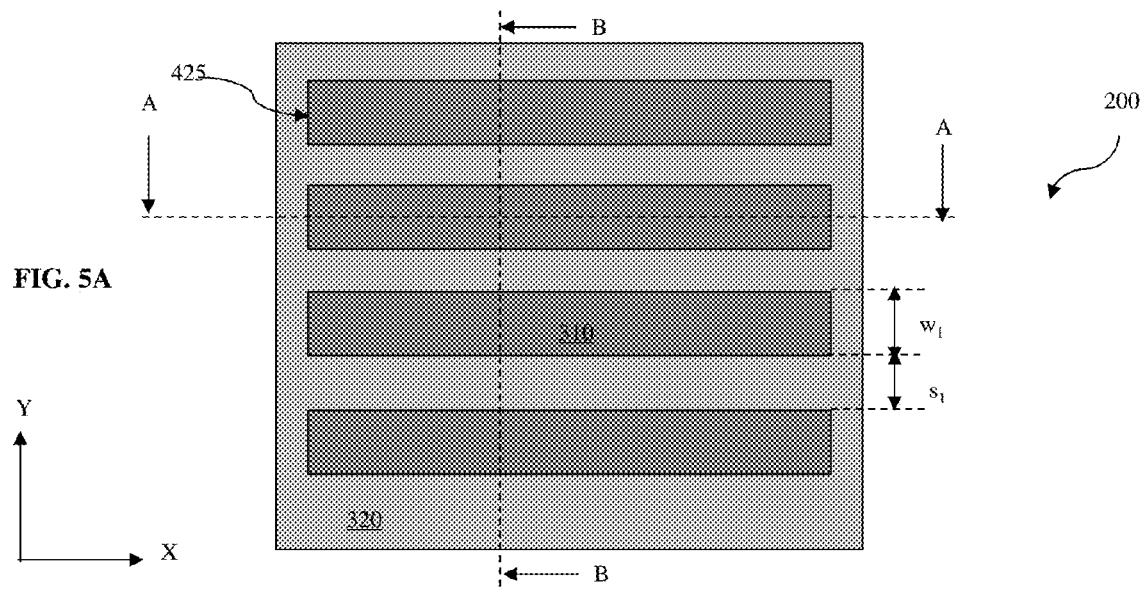
FIG. 5A is a top view of an example of a semiconductor device in accordance with some embodiments.
Figure 5B:
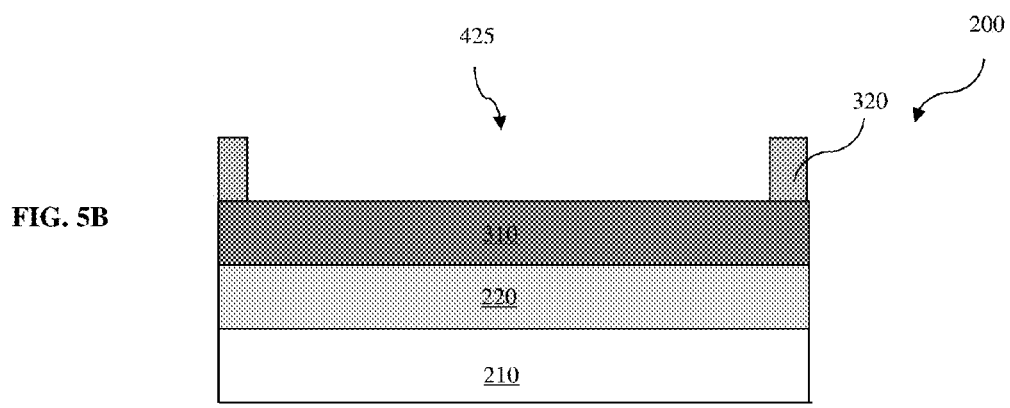
FIG. 5B is a cross-sectional view of an example semiconductor device in accordance with some embodiments, along the line A-A in FIG. 5A.
Figure 5C:
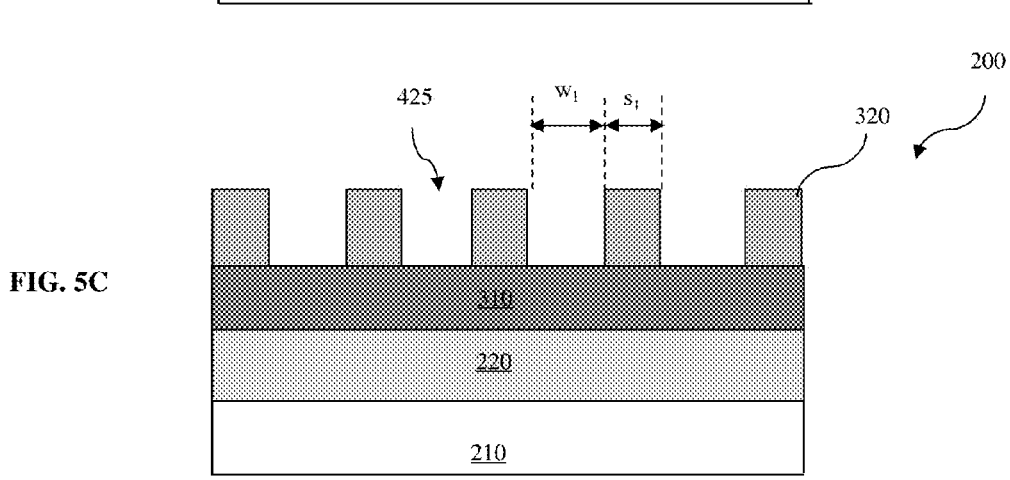
FIG. 5C is a cross-sectional view of an example semiconductor device in accordance with some embodiments, along the line B-B in FIG. 5A.
Figure 6A:
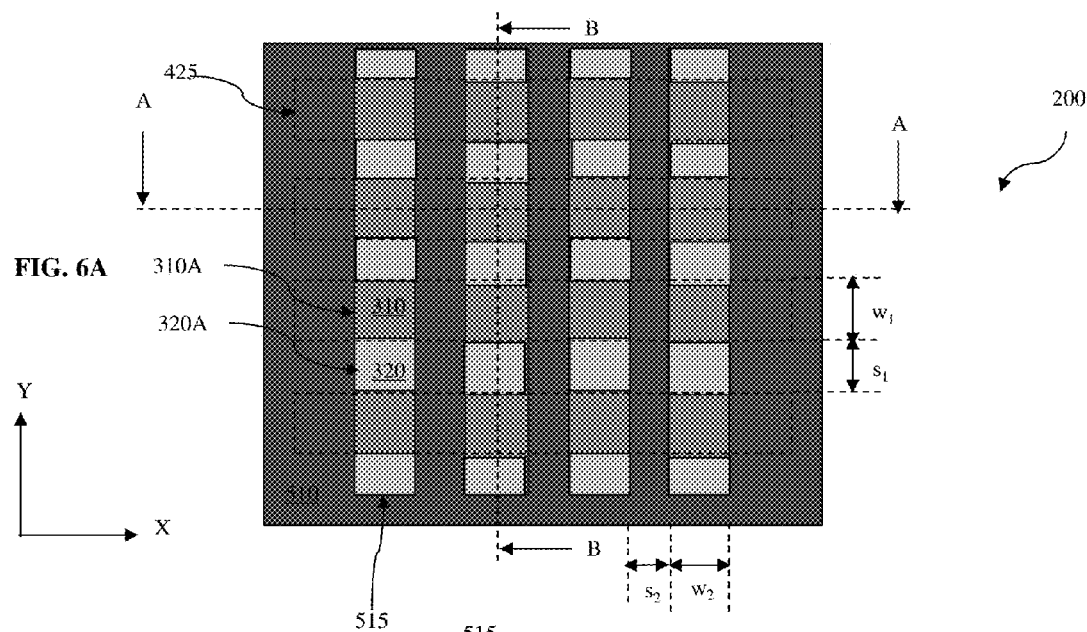
FIG. 6A is a top view of an example of a semiconductor device in accordance with some embodiments.
Figure 6B:
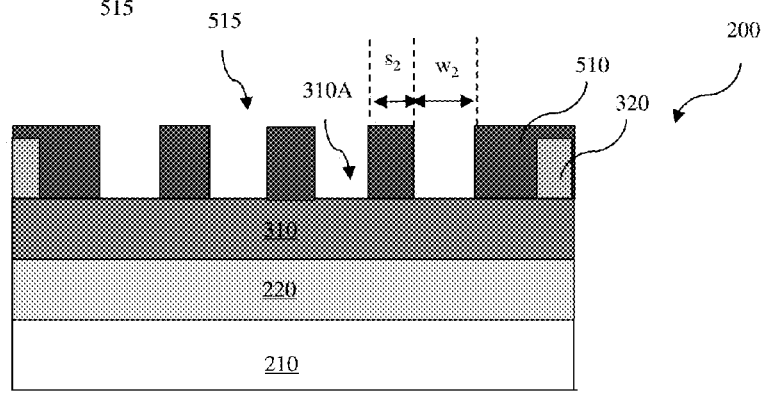
FIG. 6B is a cross-sectional view of an example semiconductor device in accordance with some embodiments, along the line A-A in FIG. 6A.
Figure 6C:
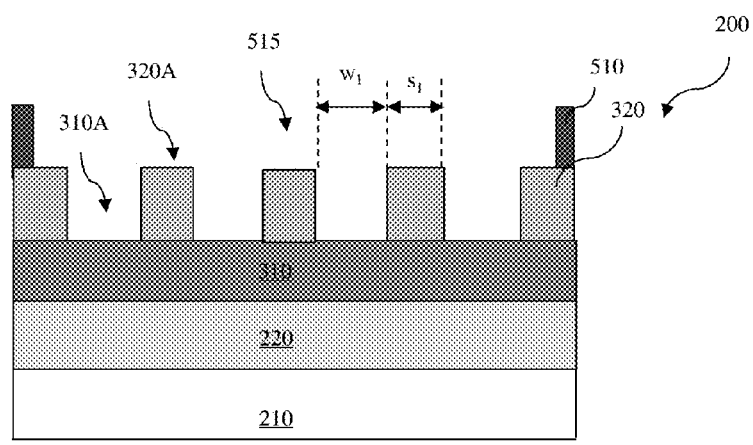
FIG. 6C is a cross-sectional view of an example semiconductor device in accordance with some embodiments, along the line B-B in FIG. 6A.
Figure 7A:
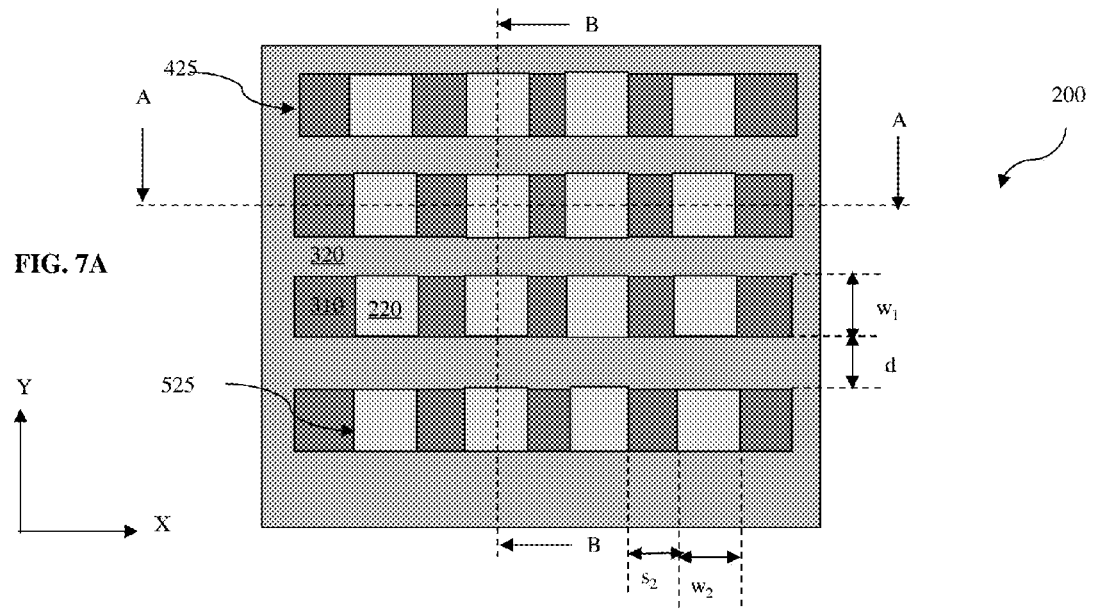
FIG. 7A is a top view of an example of a semiconductor device in accordance with some embodiments.
Figure 7B:
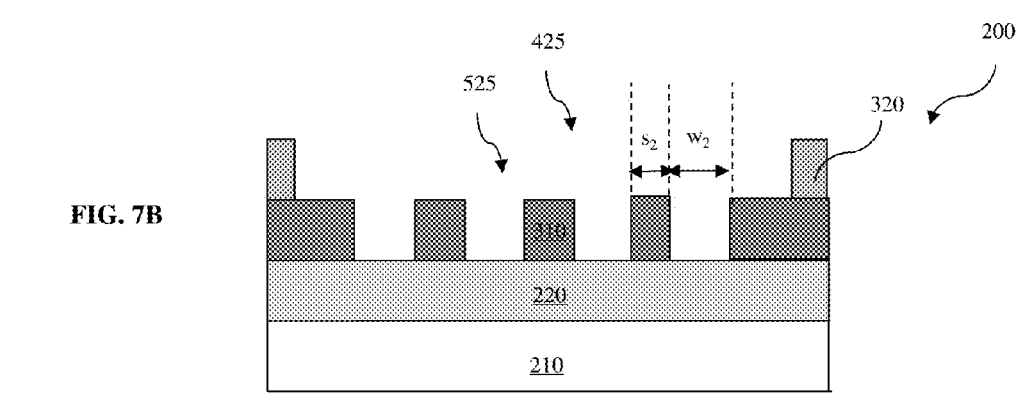
FIG. 7B is a cross-sectional view of an example semiconductor device in accordance with some embodiments, along the line A-A in FIG. 7A.
Figure 7C:
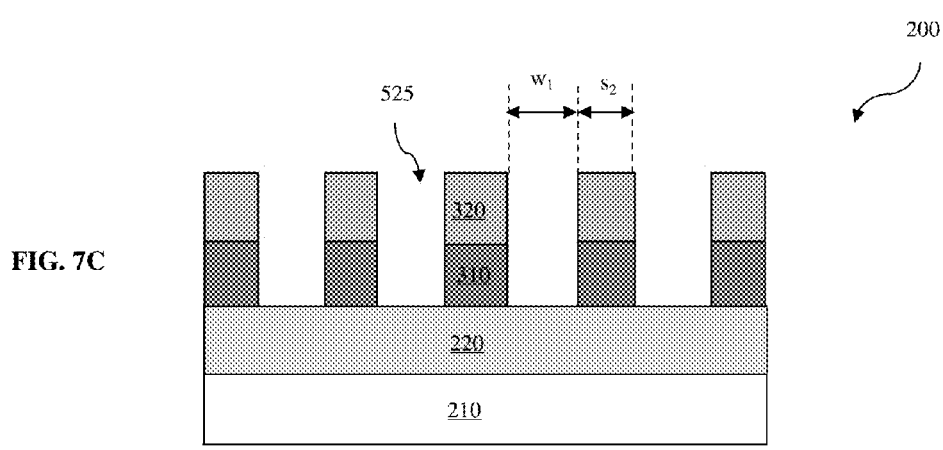
FIG. 7C is a cross-sectional view of an example semiconductor device in accordance with some embodiments, along the line B-B in FIG. 7A.
Figure 8A:
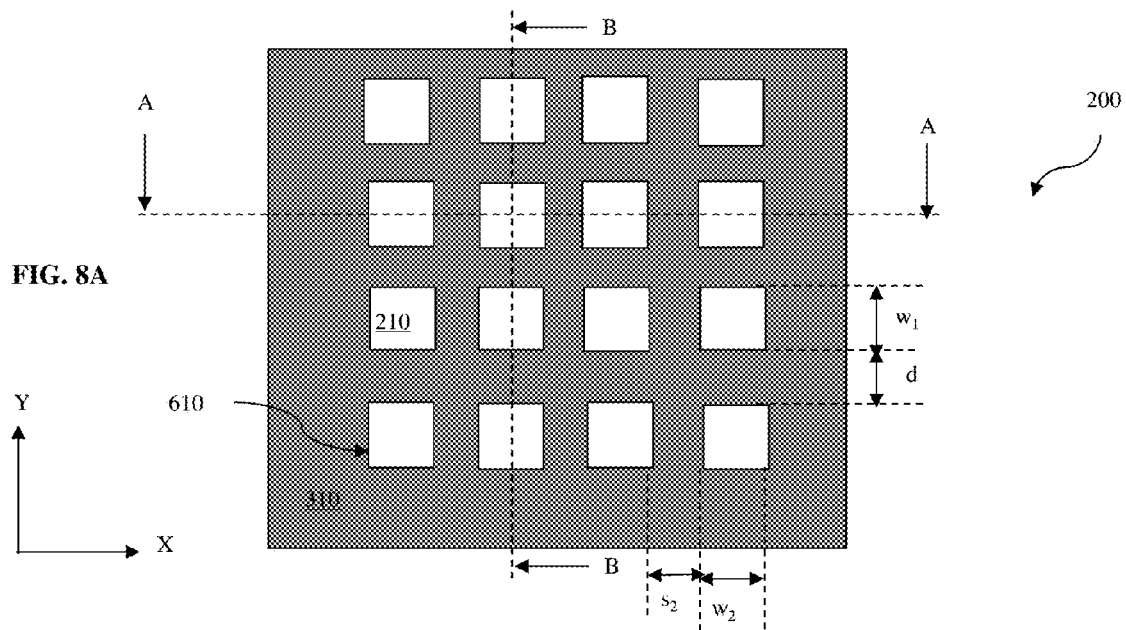
FIG. 8A is a top view of an example of a semiconductor device in accordance with some embodiments.
Figure 8B:
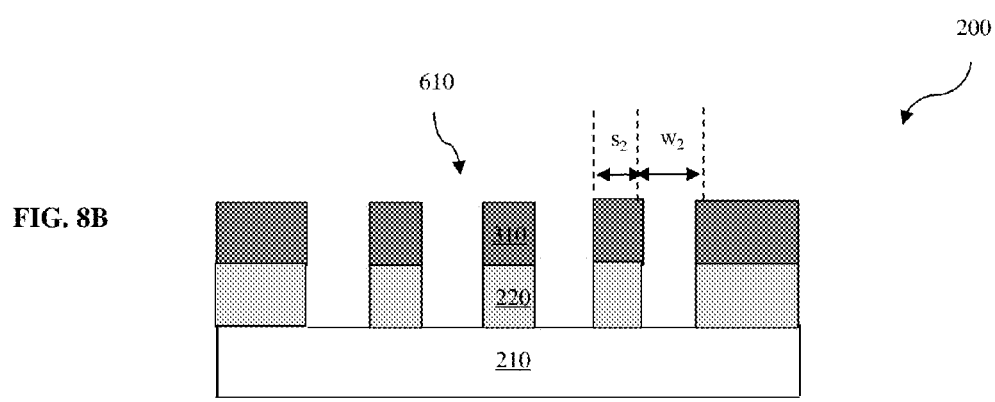
FIG. 8B is a cross-sectional view of an example semiconductor device in accordance with some embodiments, along the line A-A in FIG. 8A.
Figure 8C:
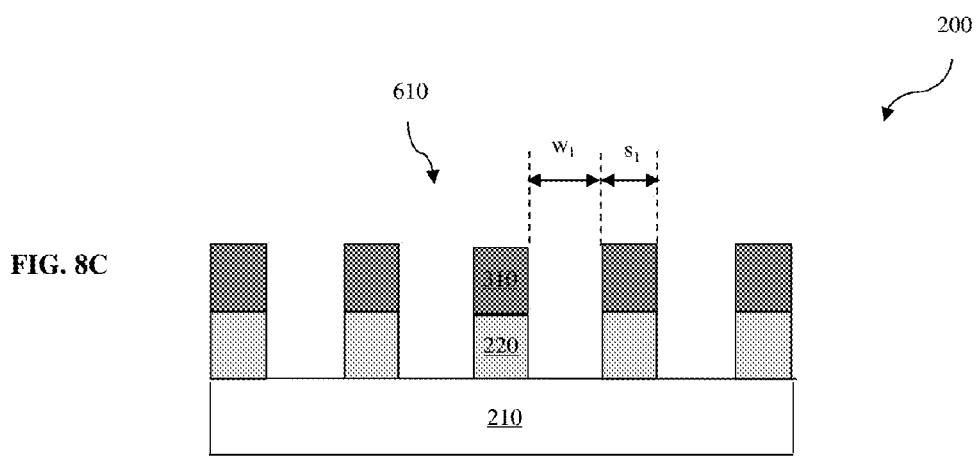
FIG. 8C is a cross-sectional view of an example semiconductor device in accordance with some embodiments, along the line B-B in FIG. 8A.

In the present embodiment, a plurality of features (e.g. hole type features) is to be formed in the material layer 220. However, current semiconductor manufacturing techniques limit the effectiveness of forming features in a material layer due to diffraction, resolution and other process effect of the optical imaging tool in a lithography process, In that regard, FIG. 3A shows a plurality of circle-holes 332 that are desired to be formed in a resist layer 334. However, due to diffraction, resolution and other process effect of the optical imaging tool in a lithography process, irregularities/distortions in resist patterns (circle-hole openings) may happen. FIG. 3B shows such problems that can occur to the circle-holes 332, such as their irregular shapes. If these irregularities/distortions are transferred to form features (such as hole type features) over a layer (such as the material layer 220) in the substrate 210, it may significantly alter the electrical properties of the semiconductor device 200. The present discourse provides methods to reduce irregularities/distortions in forming hole type features in the material layer 220.

Referring to FIGS. 1 and 4A-4C, once the workpiece 205 is received, the method of 100 proceeds to step 104 by performing a first lithography process to form a first patterned resist layer 410 over the second HM layer 320. In the present embodiment, the first patterned resist layer 410 has a plurality of first rectangular shape opening 415 (referred to as line opening) parallel to each other and extends along a first direction (X-direction). An exemplary lithography process may include forming a resist layer, exposing the resist layer by a lithography exposure process, performing a post-exposure bake process, and developing the resist layer to form the patterned resist layer. In the present embodiment, a first width $w_1$ of the first line opening 415 is chosen as a target first width along the Y-direction of a square-hole type feature to be formed later and a first space $s_1$ between two adjacent first line openings 415 is chosen as a target first space along the Y-direction between two adjacent square-hole type features to be formed.

Referring to FIGS. 1 and 5A-5C, the method of 100 proceeds to step 106 by etching the second HM layer 320 through the first patterned resist 410 to transfer the first line openings 415 to first trenches 425 in the second HM layer 320. Respective portions of the first HM layer 310 are exposed in the first trenches 425. In some embodiments, the etch process includes an anisotropic dry etch. For example, the etch process is a plasma anisotropic etch. Thus, the first trench 425 carries the first width $w_1$ and a space between two adjacent first trenches 425 is same as $s_1$. In some embodiments, the etch process is properly chosen to selectively remove the second HM layer 320 but does not substantially etch the first HM layer 310. As has been mentioned previously, with an adequate etch selectivity, the first HM layer 310 serves as an etch stop layer, which improves etch process window and profile control. A resist strip process is then applied to remove any remaining first patterned resist layers 410.

Referring to FIGS. 1 and 6A-6C, the method of 100 proceeds to step 108 by performing a second lithography process to form a second patterned resist layer 510 over the second HM layer 320. The second patterned resist layer 510 has a plurality of second line openings 515 parallel to each other. In the present embodiment, the second line openings 515 are along a second direction (Y-direction) which is perpendicular to the first direction (X-direction). In the present embodiment, the second line opening 515 has a second width $w_2$, which is chosen as a target second width along the X-direction of the square-hole type feature to be formed and a second space $s_2$ between two adjacent second line openings 515 is chosen as a target second space along the X-direction between two adjacent square-hole type features to be formed. The second line openings 515 overlap perpendicularly with respect to the first trench 425 (first trenches are shown in dot lines in FIG. 6A) and respective portions of the first HM layer 310 (through the first trenches 425) are exposed within the second line openings 515, referred to as an exposed first HM layers 310A. In the meantime, respective portions of the second HM layer 320 between two first trenches 425 are also exposed in the second line openings 515, referred to as exposed second HM layers 320A. The second patterned resist layer 510 is formed similarly in many respects to the first patterned resist layer 410 discussed above association with FIGS. 4A-4C.

Referring to FIGS. 1 and 7A-7C, the method of 100 proceeds to step 110 by etching the exposed first HM layers 310A through the second patterned resist layer 510. The etch process is properly chosen to selectively remove the exposed first HM layers 320A but does not substantially etch the exposed second HM layers 320A and the material layer 220. Therefore, the exposed second HM layers 320A serve as sub-etch-mask to protect the first HM layer 310 underneath of it during etching the exposed first HM layers 310A. Thus, the second patterned resist layer 510 and the exposed second HM layers 320A serve as the etching mask together, and results in forming rectangular-shape first holes 525 in the first HM layer 310 and respective portions of the material layer 220 are exposed in the first rectangular-shape holes 525. The each of rectangular-shape hole 525 carries the first width $w_1$ along the Y-direction, the second width $w_2$ along the X-direction. A space between two adjacent first rectangular-shape holes 525 along Y-direction is same as $s_1$ and a space between two adjacent first rectangular-shape holes 525 along X-direction is same as $s_2$. The first HM layer 310A is etched similarly in many respects to the etching process first patterned discussed above association with FIGS. 5A-5C. A resist strip process is then applied to remove any remaining second patterned resist layers 510.

Figure 9A:
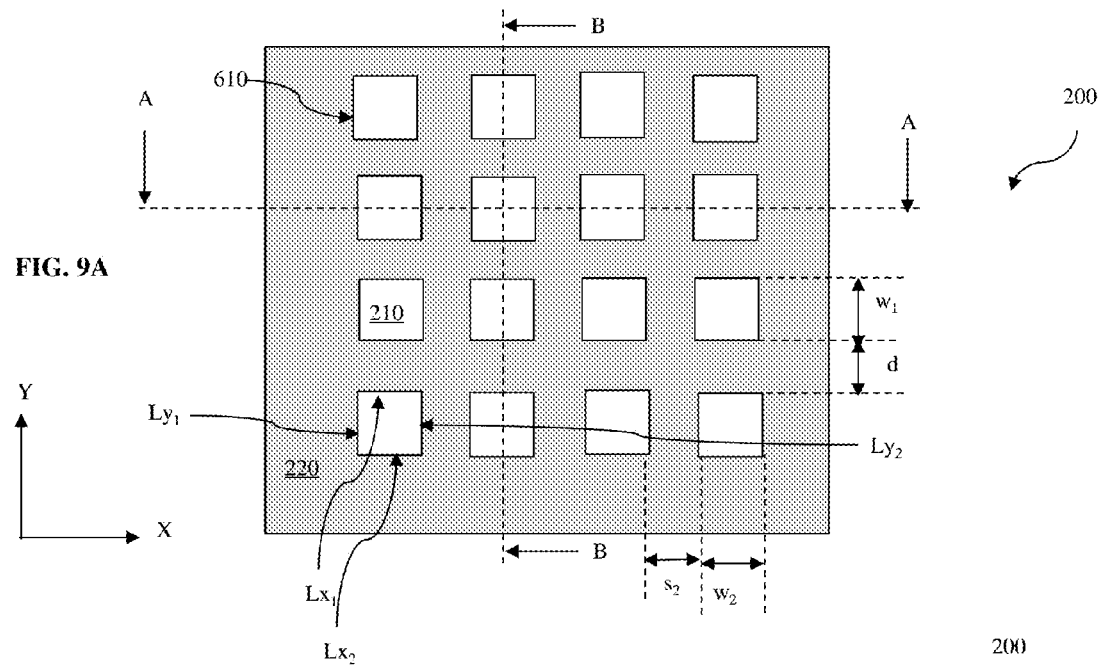
FIG. 9A is a top view of an example of a semiconductor device in accordance with some embodiments.
Figure 9B:
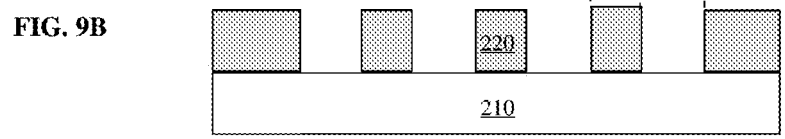
FIG. 9B is a cross-sectional view of an example semiconductor device in accordance with some embodiments, along the line A-A in FIG. 9A.
Figure 9C:
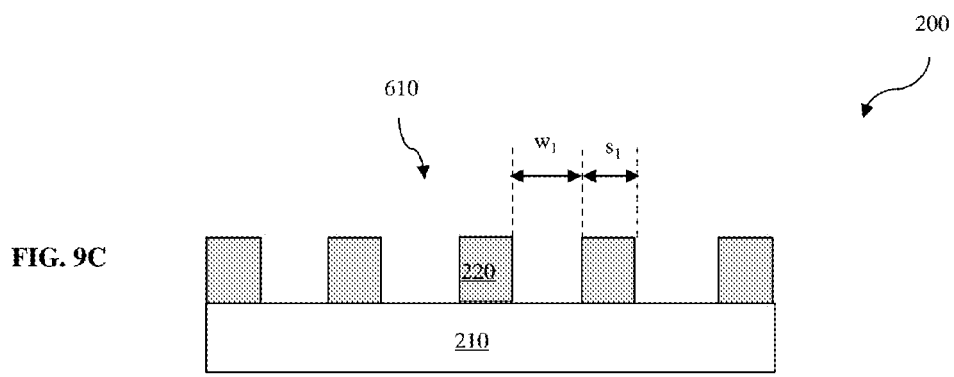
FIG. 9C is a cross-sectional view of an example semiconductor device in accordance with some embodiments, along the line B-B in FIG. 9A.

Referring to FIGS. 1 and 8A-8C, the method of 100 proceeds to step 112 by etching the material layer 220 through first rectangular-shape holes 525 to form second rectangular-shape holes 610 in the material layer 220. A portion of the substrate 210 is exposed in a respective second rectangular-shape hole 610. In the present embodiment, the etch process is properly chosen to selectively remove the material layer 220 but does not substantially etch the first HM layer 310 and the substrate 210. The etch process may include an anisotropic dry etch, such as a plasma anisotropic etch. In some embodiments, prior to etching the material layer 220, the remaining second HM layer 320 is removed by a proper etching process. After forming the second rectangular-shape holes 610 in the material layer 220, the first HM layer 310 is then removed by another proper etch process, as shown in FIGS. 9A-9C.

Referring again to FIG. 9A, in the present embodiment, the second rectangular-shape hole 610 has a first pair of sides, $Ly_1$ and $Ly_2$ along the Y direction and a second pair of sides, $Lx_1$ and $Lx_2$, along the X-direction. The first pair of sides, $Ly_1$ and $Ly_2$, is defined by the first lithography process with the first line opening 415 and the second pair of sides, $Lx_1$ and $Lx_2$, is defined by the second lithography process with the second line opening 515. In another words, the rectangular-shape holes 610 is defined by line opening patterns in different lithography processes. Therefore, irregularities/distortions associating with a hole opening by one lithography process are avoided. As has been mentioned previously, the rectangular-shape hole 610 has the first width $w_1$ along Y-direction and the second width $w_2$ along X-direction. In some embodiment, the rectangular-shape hole 610 is a square-shape hole. Two adjacent the rectangular-shape holes 610 are apart by the first space $s_1$, along the Y-direction, in a repeatable manner. While two adjacent the rectangular-shape holes 610 are apart by the second space $s_2$, along the X-direction, in a repeatable manner as well. Therefore a density of second rectangular-shape holes 610 is uniform in the material layer 220.

Figure 10:
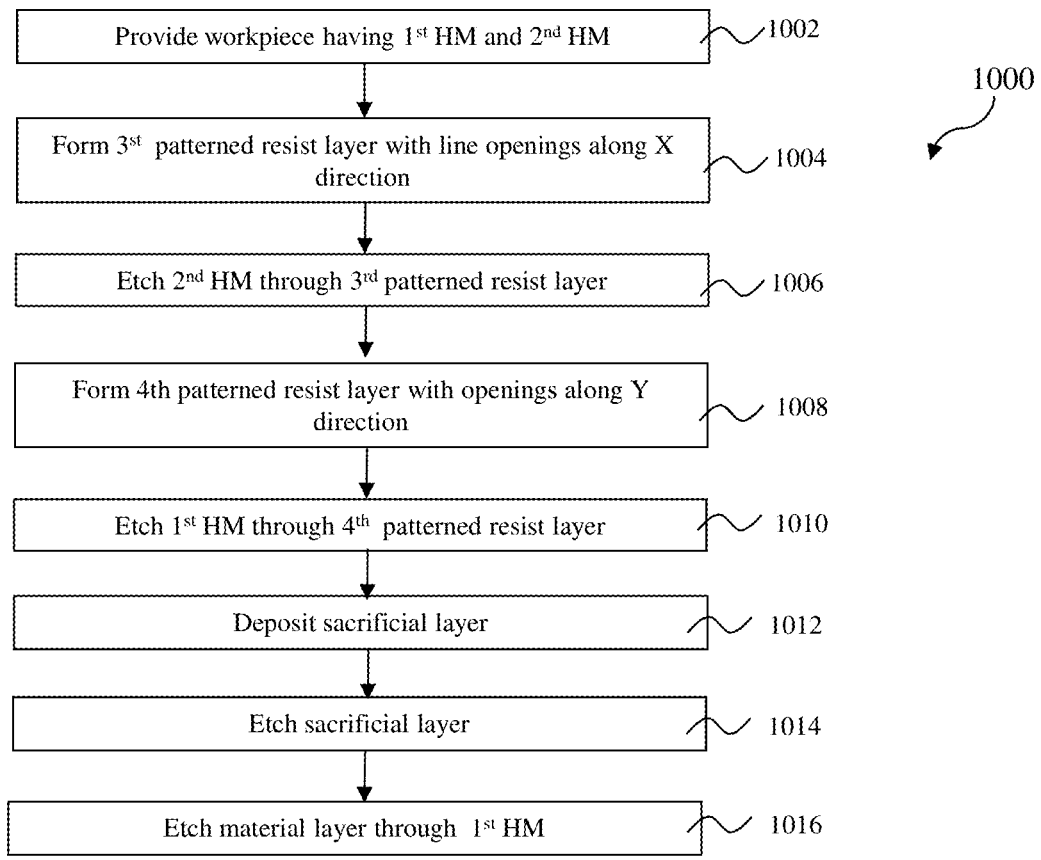
FIG. 10 is a flowchart of another example method for fabricating a semiconductor device constructed in accordance with some embodiments.
Figure 11A:
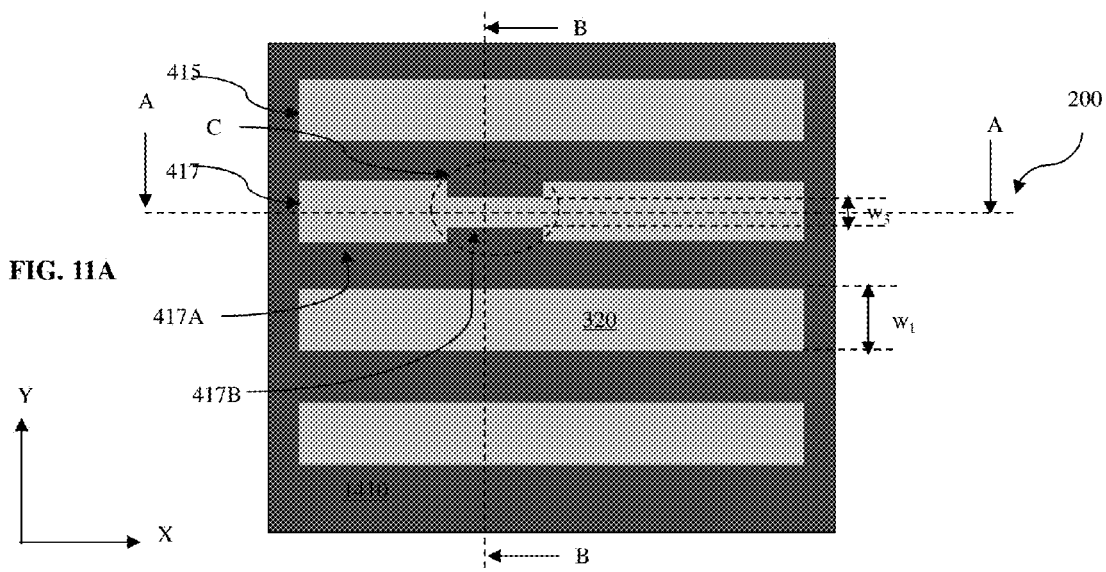
FIG. 11A is a top view of an example of a semiconductor device in accordance with some embodiments.
Figure 11B:
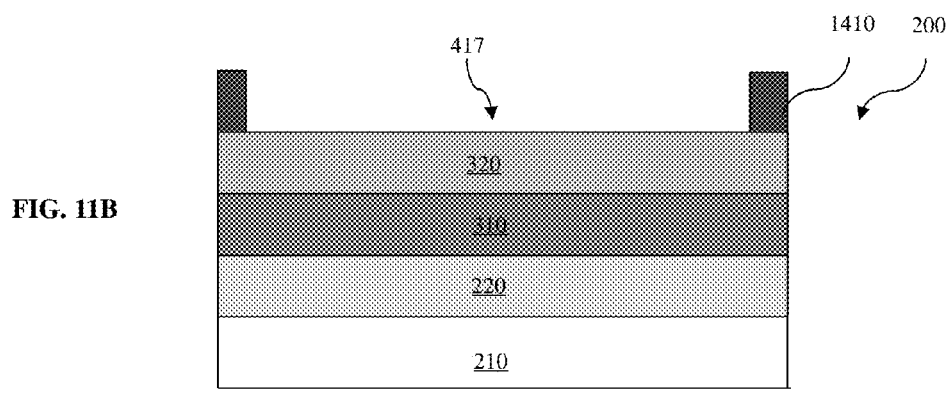
FIG. 11B is a cross-sectional view of an example semiconductor device in accordance with some embodiments, along the line A-A in FIG. 11A.
Figure 11C:
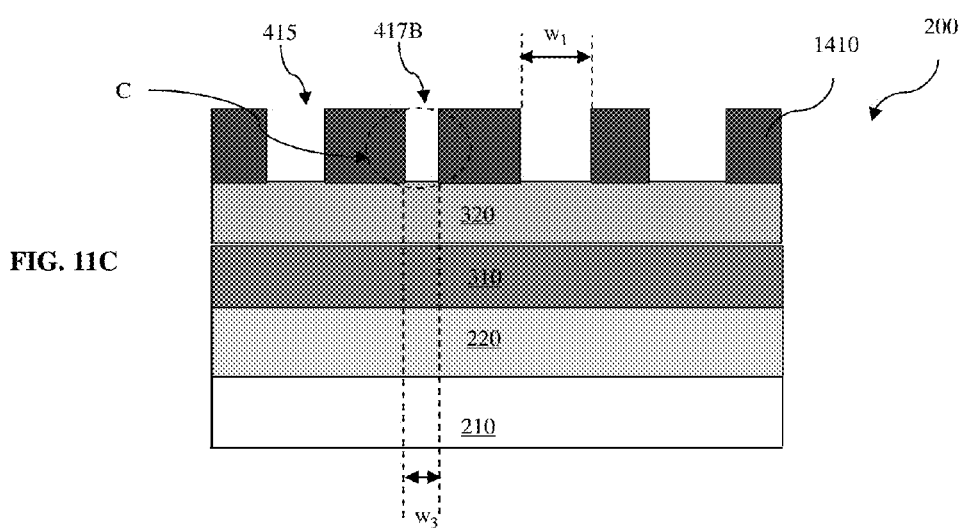
FIG. 11C is a cross-sectional view of an example semiconductor device in accordance with some embodiments, along the line B-B in FIG. 11A.
Figure 12A:
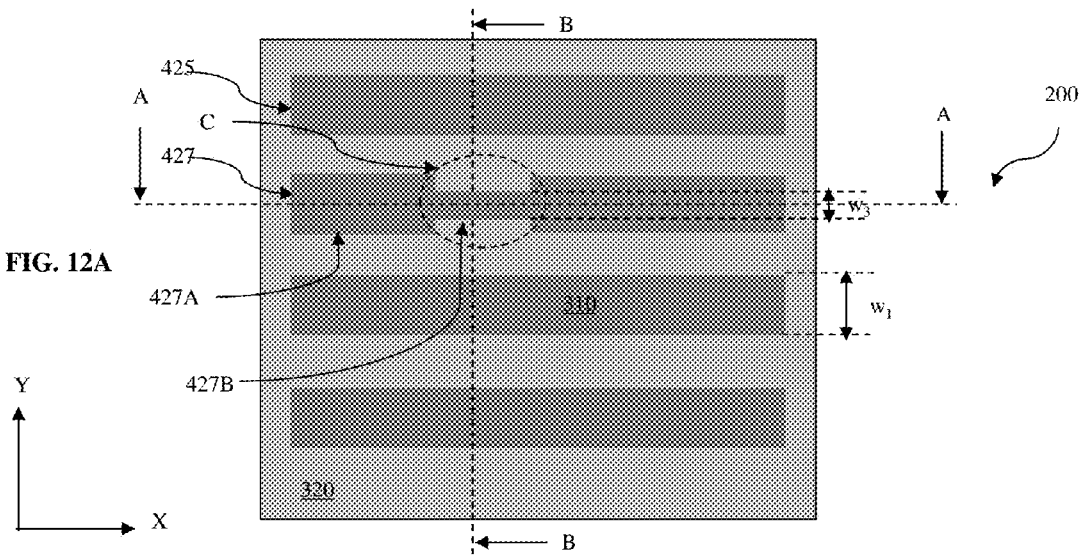
FIG. 12A is a top view of an example of a semiconductor device in accordance with some embodiments.
Figure 12B:
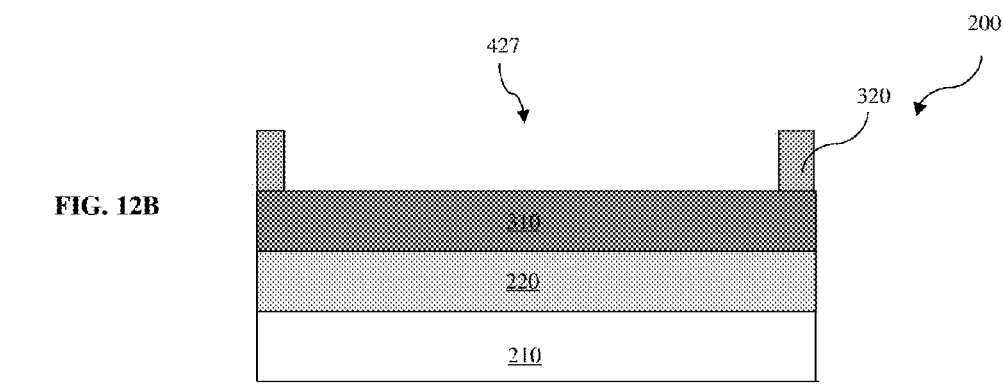
FIG. 12B is a cross-sectional view of an example semiconductor device in accordance with some embodiments, along the line A-A in FIG. 12A.
Figure 12C:
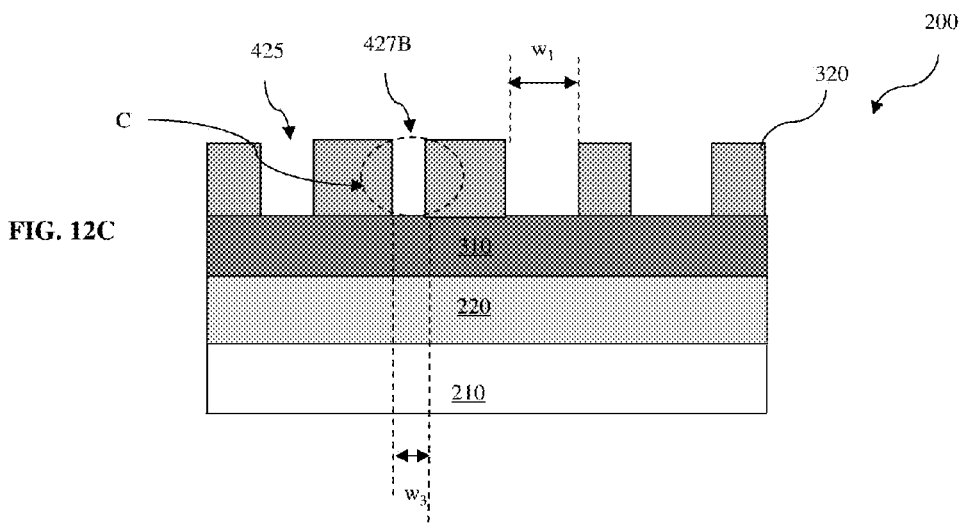
FIG. 12C is a cross-sectional view of an example semiconductor device in accordance with some embodiments, along the line B-B in FIG. 12A.
Figure 13A:
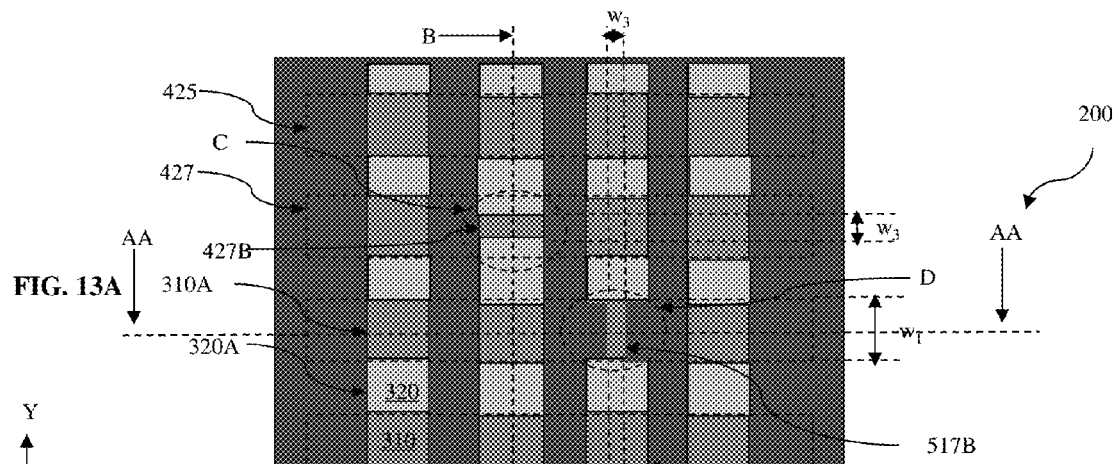
FIG. 13A is a top view of an example of a semiconductor device in accordance with some embodiments.
Figure 13B:
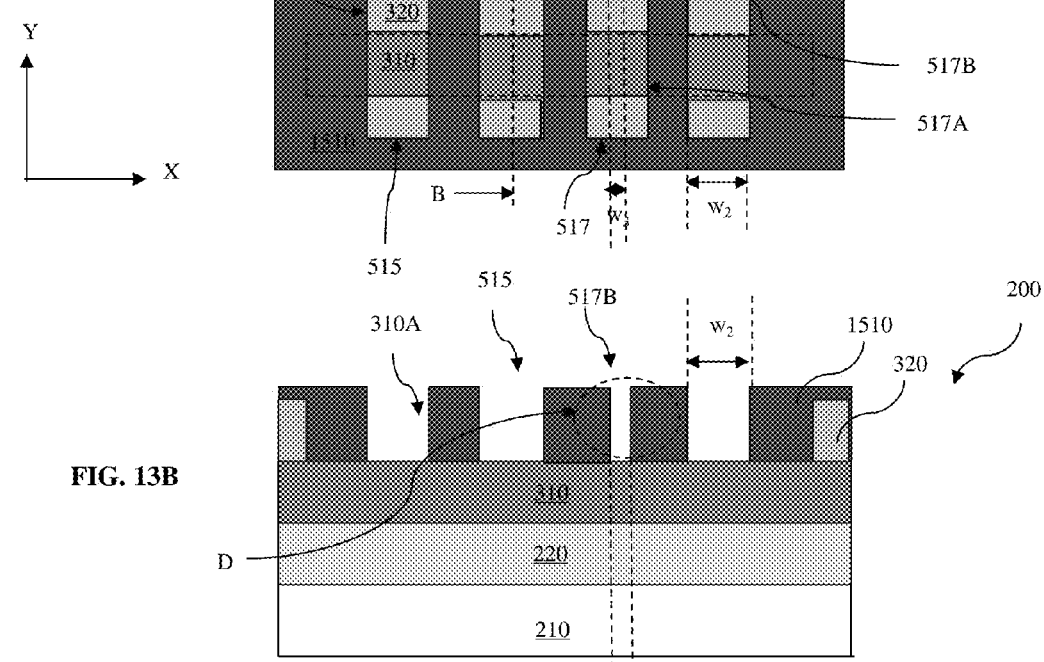
FIG. 13B is a cross-sectional view of an example semiconductor device in accordance with some embodiments, along the line AA-AA in FIG. 13A.
Figure 13C:
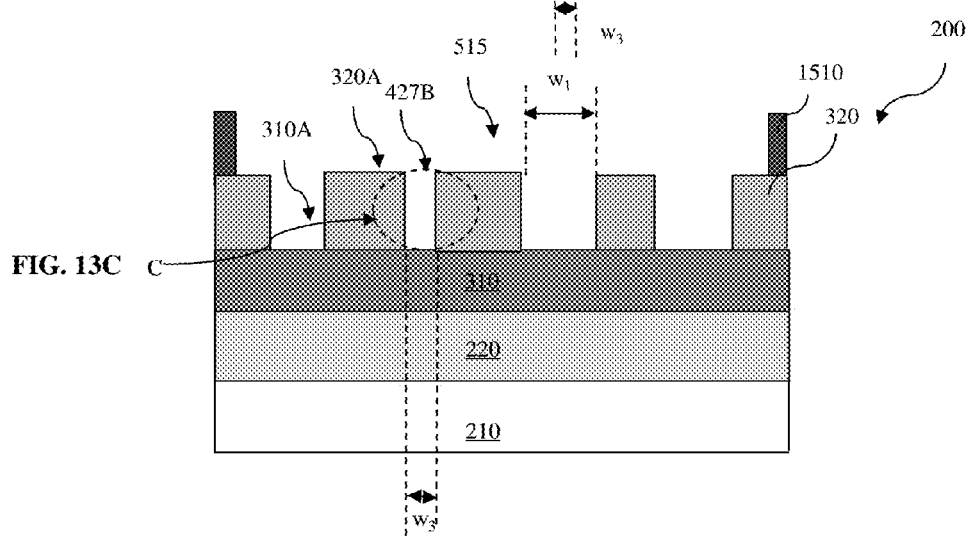
FIG. 13C is a cross-sectional view of an example semiconductor device in accordance with some embodiments, along the line B-B in FIG. 13A.
Figure 14A:
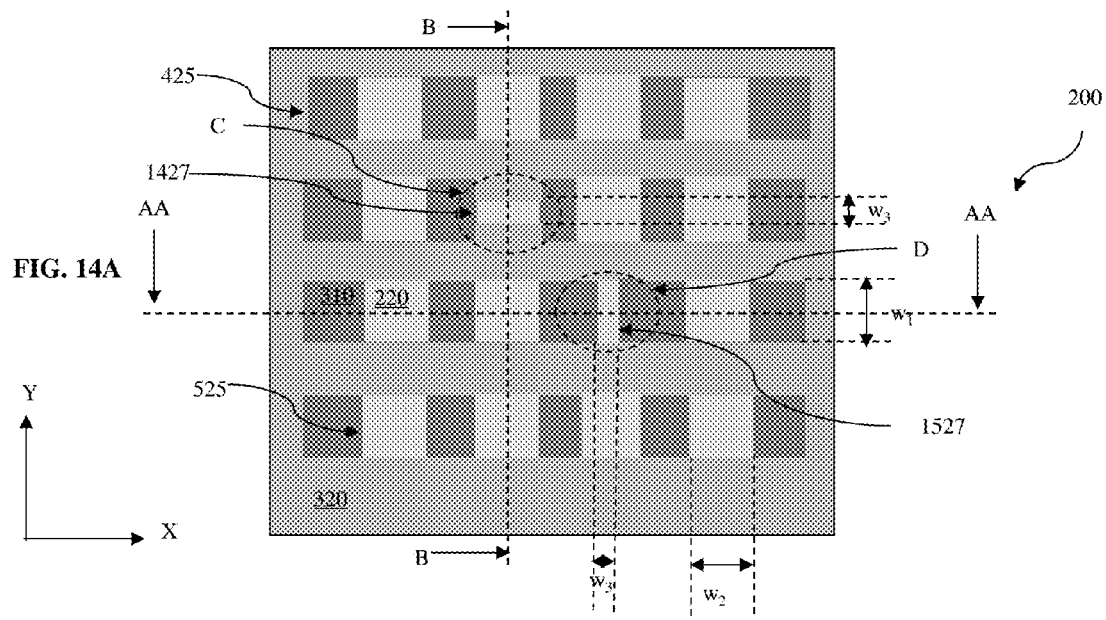
FIG. 14A is a top view of an example of a semiconductor device in accordance with some embodiments.
Figure 14B:
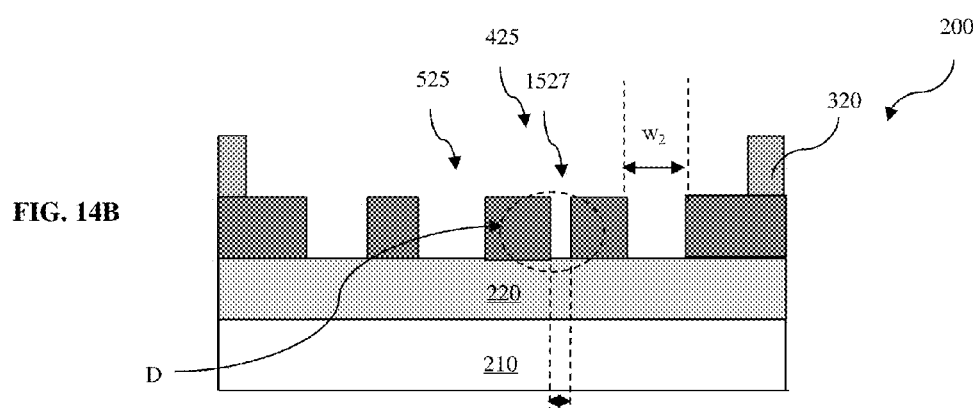
FIG. 14B is a cross-sectional view of an example semiconductor device in accordance with some embodiments, along the line AA-AA in FIG. 14A.
Figure 14C:
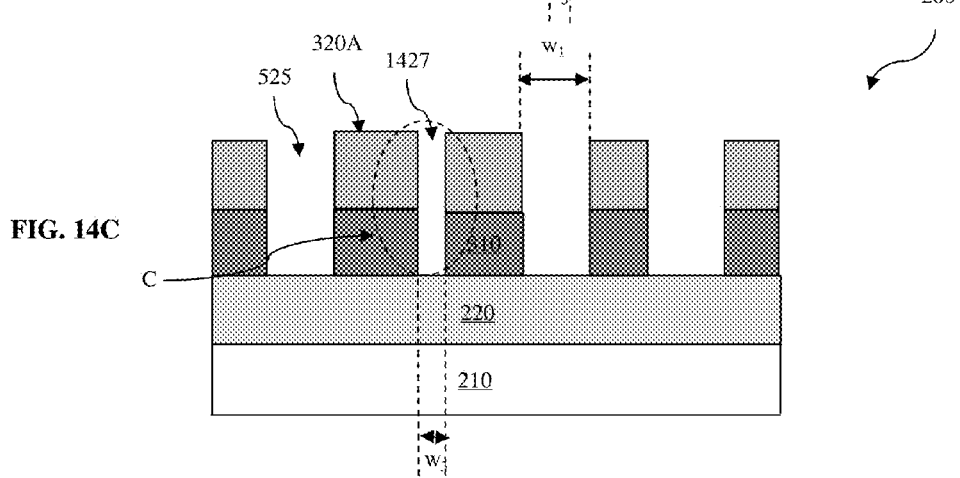
FIG. 14C is a cross-sectional view of an example semiconductor device in accordance with some embodiments, along the line B-B in FIG. 14A.

Sometimes a non-uniform density of the second rectangular-shape holes 610 in the material layer 220 is needed and the following description will be directed to a method of forming non-uniform density of the rectangular-shape holes 610 in the material layer 220. FIG. 10 is a flowchart of an example method 1000 for fabricating a semiconductor device 200. The first step of the method 1000, 1002, is similar to step 102 of the method 100. The present disclosure repeats reference numerals and/or letters in the various embodiments. This repetition is for the purpose of simplicity and clarity such that repeated reference numerals and/or letters indicate similar features amongst the various embodiments unless stated otherwise.

Referring to FIGS. 10 and 11A-11C, once the workpiece 205 is received, the method of 1000 proceeds to step 1004 by forming a third patterned resist layer 1410 over the second HM layer 320. The third patterned resist layer 1410 has a plurality of first line openings 415 and a plurality of third line opening 417 along the X-direction and parallel to each other. In the present embodiment, the third line opening 417 has a first line opening portion 417A and a second line opening portion 417B (in a location C), such that the second line opening portion 417B has a width that is narrower (or smaller) than a width of the first line opening portion 417A. In some embodiments, the first line opening portion 417A has the first width $w_1$ and the second line opening portion 417B has a third width $w_3$, which is much smaller than the first width $w_1$. The third patterned resist layer 1410 is formed similarly in many respects to the first patterned resist layer 410 discussed above association with FIGS. 4A-4C.

Referring to FIGS. 10 and 12A-12C, the method of 1000 proceeds to step 1006 by etching the second HM layer 320 through the third patterned resist 1410 to transfer the first and third line openings, 415 and 417, to first trenches and third trenches, 425 and 427, respectively, in the second HM layer 320. The third trench 427 has a first portion 427A and a second portion 427B. The second HM layer 320 is etched similarly in many respects to the etch process discussed above association with FIGS. 5A-5C. Thus, the first trench 425 carries the first width $w_1$, the first portion 427A carries the first width $w_1$ and the second portion 427B carries the third width $w_3$. Respective portions of the first HM layer 310 are exposed within the first and third trenches, 425 and 427. A resist strip process is then applied to remove any remaining third patterned resist layers 1410.

Referring to FIGS. 10 and 13A-13C, the method of 1000 proceeds to step 1008 by forming a fourth patterned resist layer 1510 over the second HM layer 320. The fourth patterned resist layer 1510 has a plurality of second line openings 515 and fourth line openings 517, parallel to each other and extending along the Y-direction. In the present embodiment, the fourth line opening 517 has a first portion 517A with the second width $w_2$ and a second portion 517B with the third width $w_3$ (at a location D), which is narrower (or smaller) than the second width $w_2$. The second and fourth line openings, 515 and 517, overlap perpendicularly with respect to the respective first and third trenches, 425 and 427. Respective portions of the first HM layer 310 (through the first trench 425 and the third trench 427) are exposed within the second line openings 515 and the fourth line opening 517, referred to as the exposed first HM layers 310A. In the meantime, respective portions of the second HM layer 320 are also exposed within the second line opening 515 and the fourth line opening 517, referred to as the exposed second HM layer 320A. The fourth patterned resist layer 1510 is formed similarly in many respects to the first patterned resist layer 410 discussed above association with FIGS. 4A-4C.

Figure 15A:
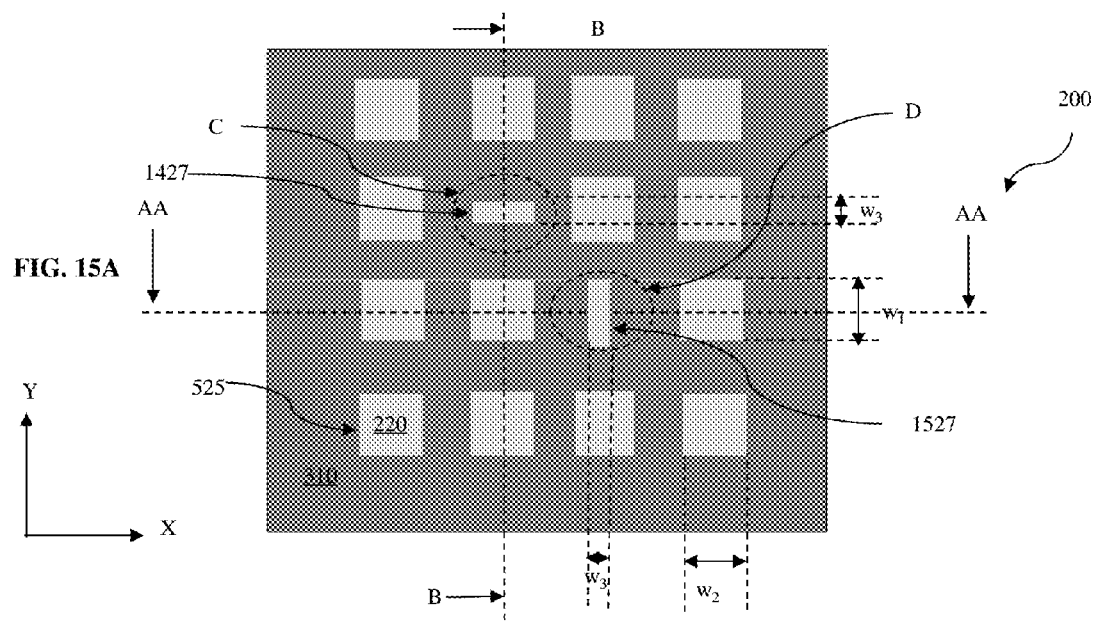
FIG. 15A is a top view of an example of a semiconductor device in accordance with some embodiments.
Figure 15B:
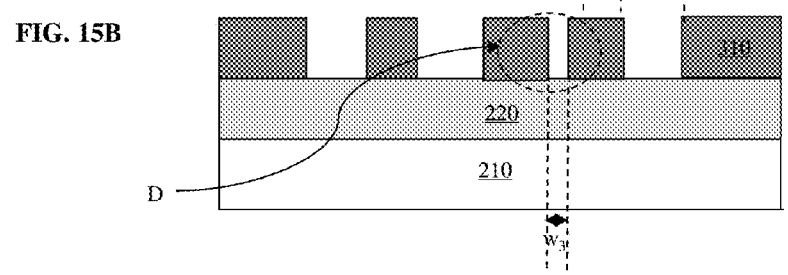
FIG. 15B is a cross-sectional view of an example semiconductor device in accordance with some embodiments, along the line AA-AA in FIG. 15A.
Figure 15C:
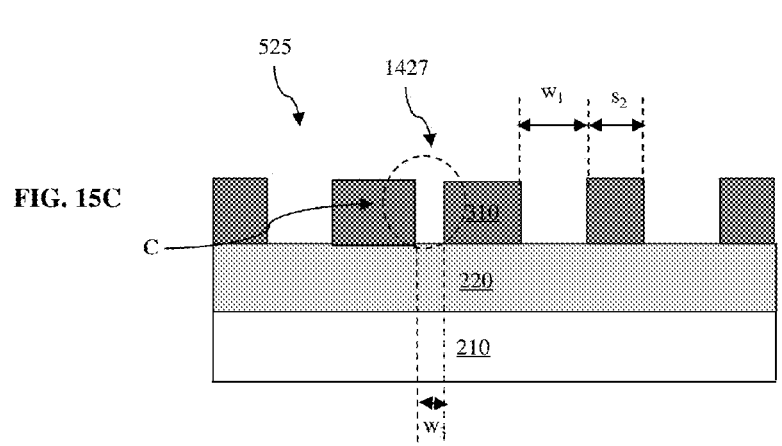
FIG. 15C is a cross-sectional view of an example semiconductor device in accordance with some embodiments, along the line B-B in FIG. 15A.
Figure 16A:
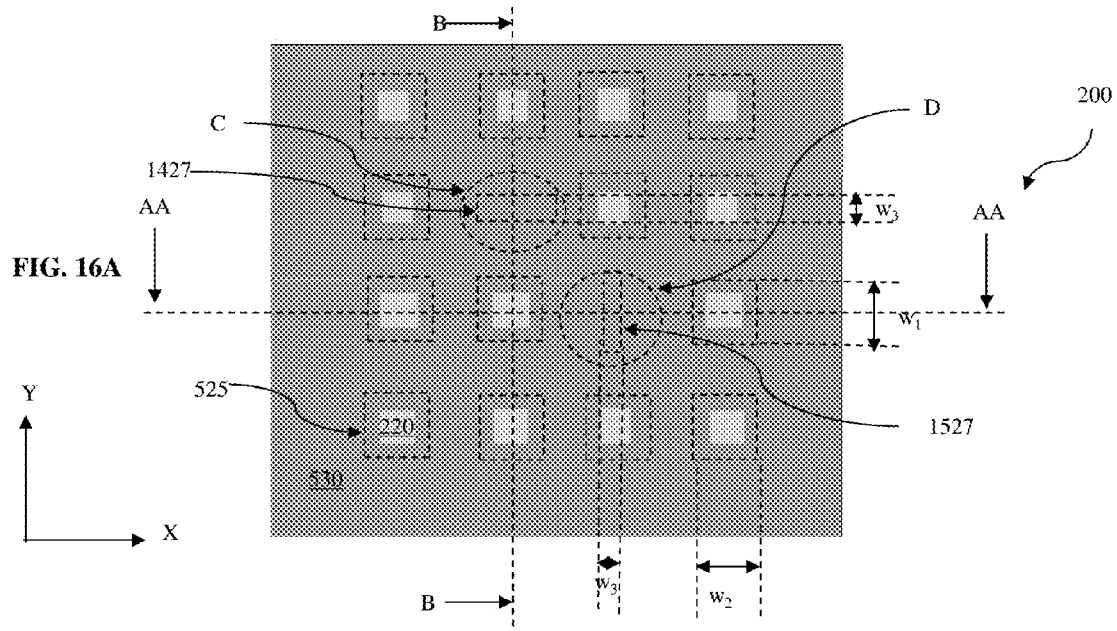
FIG. 16A is a top view of an example of a semiconductor device in accordance with some embodiments.
Figure 16B:
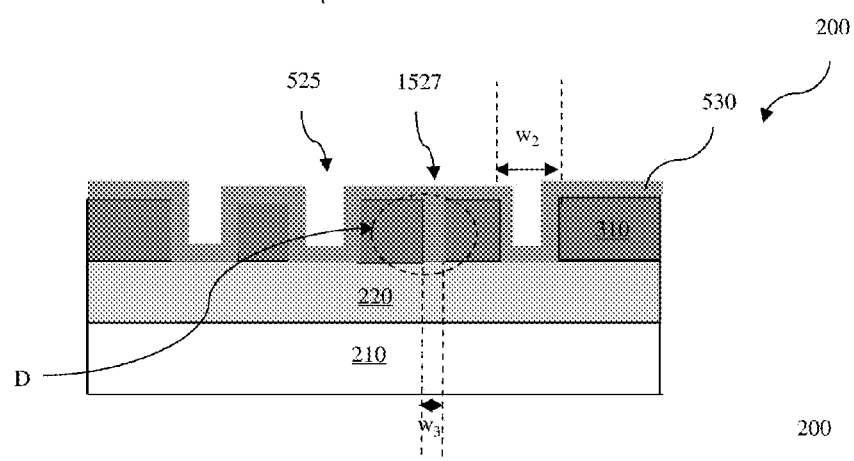
FIG. 16B is a cross-sectional view of an example semiconductor device in accordance with some embodiments, along the line AA-AA in FIG. 16A.
Figure 16C:
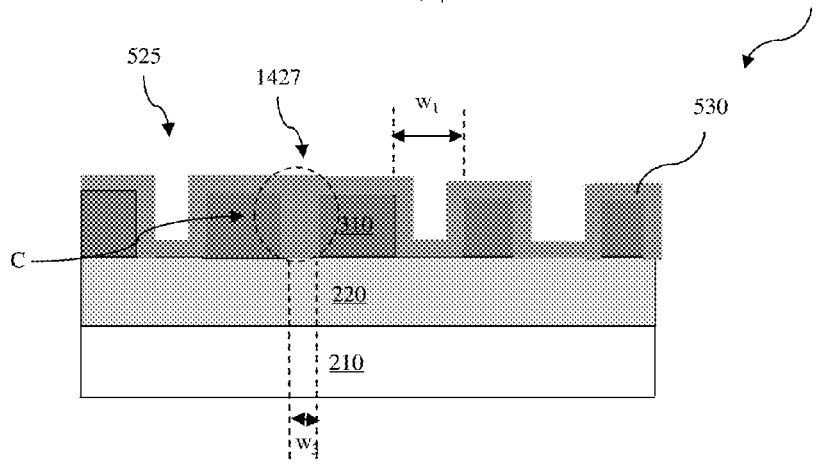
FIG. 16C is a cross-sectional view of an example semiconductor device in accordance with some embodiments, along the line B-B in FIG. 16A.
Figure 17A:
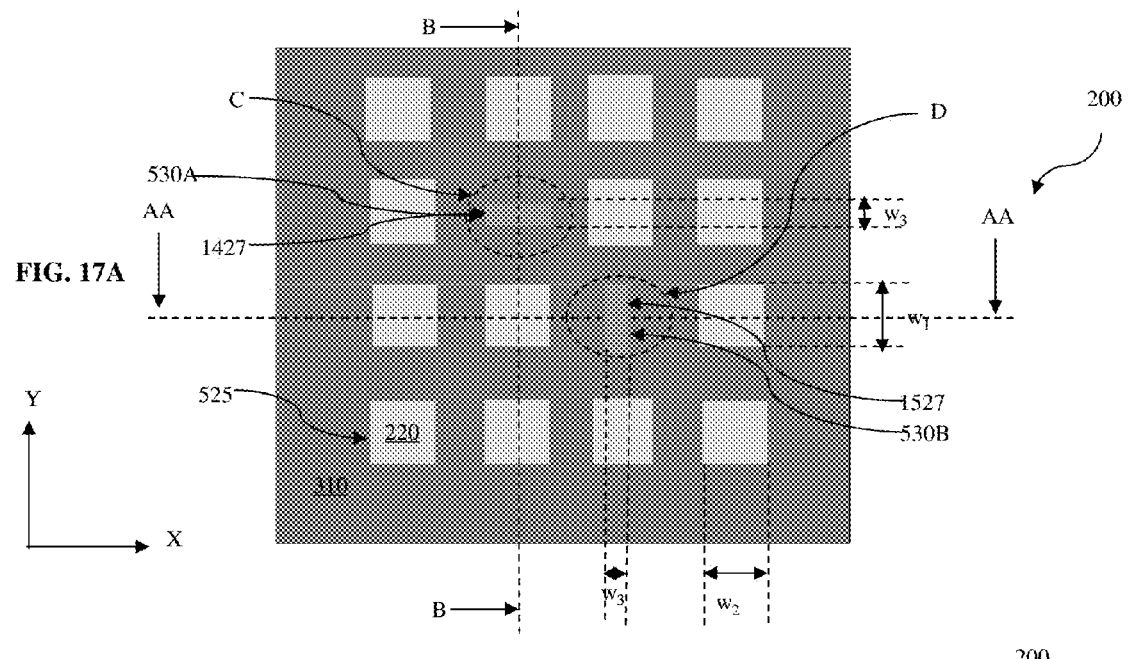
FIG. 17A is a top view of an example of a semiconductor device in accordance with some embodiments.
Figure 17B:
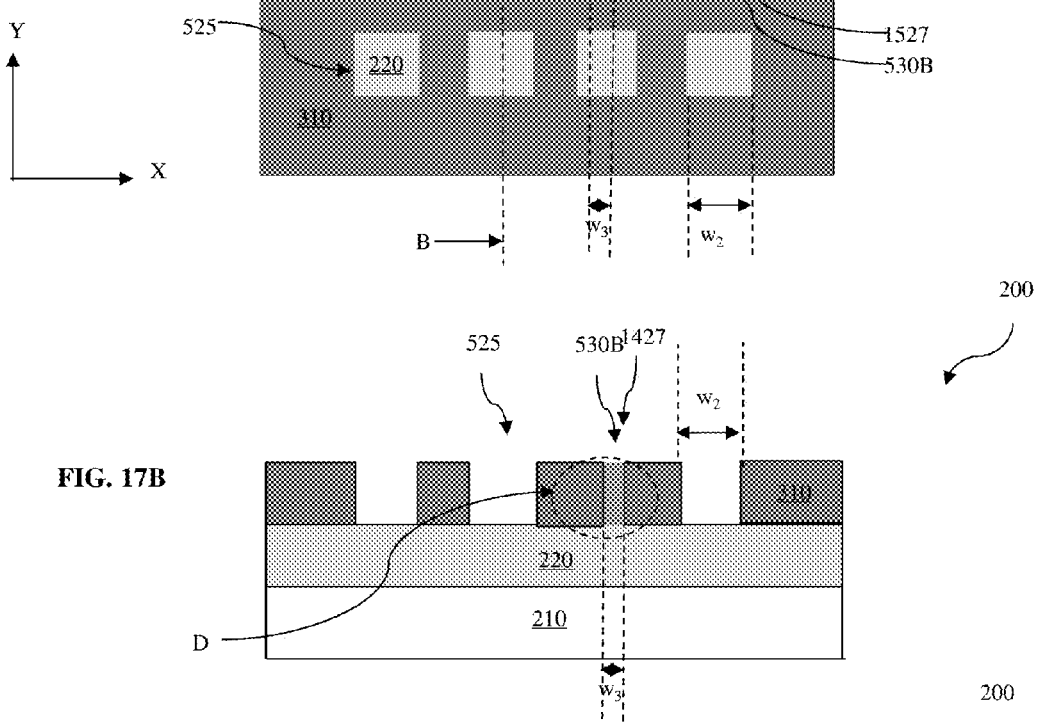
FIG. 17B is a cross-sectional view of an example semiconductor device in accordance with some embodiments, along the line AA-AA in FIG. 17A.
Figure 17C:
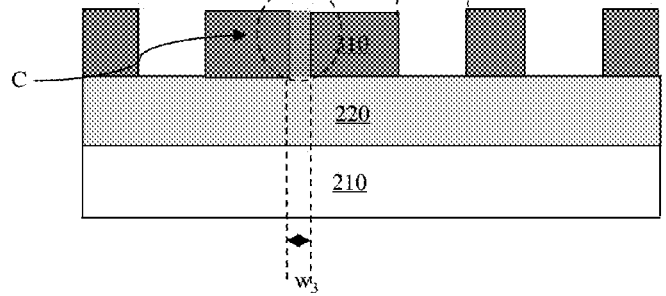
FIG. 17C is a cross-sectional view of an example semiconductor device in accordance with some embodiments, along the line B-B in FIG. 17A.
Figure 18A:
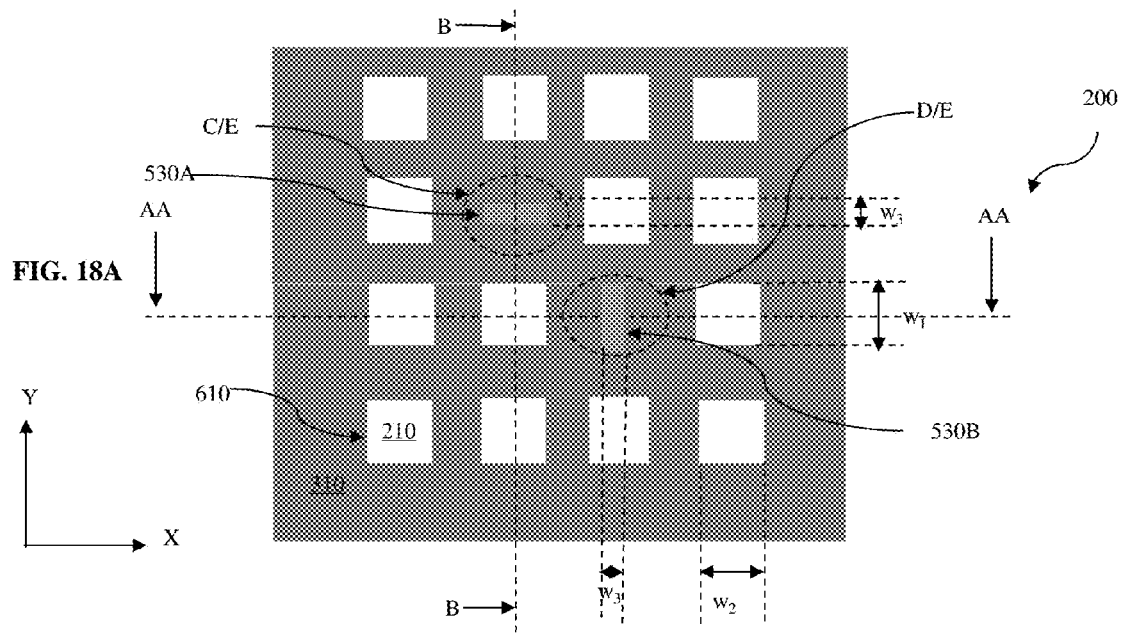
FIG. 18A is a top view of an example of a semiconductor device in accordance with some embodiments.
Figure 18B:
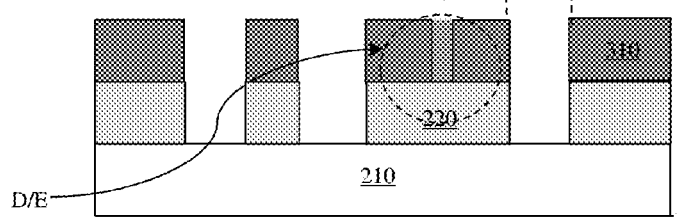
FIG. 18B is a cross-sectional view of an example semiconductor device in accordance with some embodiments, along the line AA-AA in FIG. 18A.
Figure 18C:
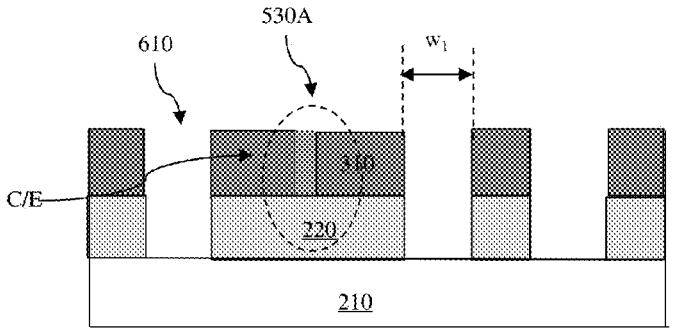
FIG. 18C is a cross-sectional view of an example semiconductor device in accordance with some embodiments, along the line B-B in FIG. 18A.

Referring to FIGS. 10 and 14A-14C, the method of 1000 proceeds to step 1010 by etching the exposed first HM layers 310A through the fourth patterned resist layer 1510. The etch process is properly chosen to selectively remove the exposed first HM layers 320A but does not substantially etch the exposed second HM layers 320A and the material layer 220. Therefore, the second HM layer 320A serves as a sub-etch-mask to protect the first HM layer 310 underneath of it during etching the exposed first HM layers 310A. Thus, the fourth patterned resist layer 1510 and the exposed second HM layers 320A serve as the etching mask together, and results in forming first rectangular-shape holes 525 in the first HM layer 310 and a first narrow trench 1427 in the location C and a second narrow trench 1527 in the location D are formed in the first HM layer 310. Respective portions of the material layer 220 are exposed in the first holes 525 and the first and second narrow trenches, 1427 and 1527. The each of first holes 525 carries the first width $w_1$ along the Y-direction, the second width $w_2$ along the X-direction. The first and second narrow trenches, 1427 and 1527, carry the third width $w_3$. The exposed first HM layer 310A is etched similarly in many respects to the etching process first patterned discussed above association with FIGS. 5A-5C. A resist strip process is then applied to remove any remaining second patterned resist layers 1510. The second HM layer 320 is removed as well by a proper etch process, as shown in FIGS. 15A-15C.

Referring to FIGS. 10 and 16A-16C, the method of 1000 proceeds to step 1012 by depositing a sacrificial layer 530 over the substrate 210, including filling in the first and second narrow trenches, 1427 and 1527. In the present embodiment, the third width $w_3$ and a thickness of the sacrificial layer 530 are controlled such that the first and second narrow trenches, 1427 and 1527, are completely filled in while the first rectangular-shape holes 525 are partially filled in, which results in a thickness of the sacrificial layer 530 in the first rectangular-shape holes is much thinner than a thickness of the sacrificial layer 530 in the first and second narrow trenches, 1427 and 1527. The sacrificial layer 530 may include spin-on glass, silicon oxide, silicon nitride, oxynitride, silicon carbide, and/or other suitable materials. In present embodiment, the sacrificial layer 530 includes a material which is different from the material layer 220 to achieve etching selectivity in subsequent etches. The sacrificial layer 350 may be deposited by CVD, PVD, ALD, spin-on coating, or other suitable techniques.

Referring to FIGS. 10 and 17A-17C, the method of 1000 proceeds to step 1014 by removing the sacrificial layer 530 from the first rectangular-shape holes 525. The etch process is properly chosen such that the sacrificial layer 530 in the first rectangular-shape hole 525 is removed and an adequate remaining thickness of the sacrificial layer 530 in the first and second narrow trenches, 1427 and 1527, is remained, which will servers as a future etch mask in a subsequent etch process. In some embodiment, the etch process include isotropic wet etch, or isotropic dry etch. For the sake of clarity to better illustration of concepts of the present disclosure, the remaining sacrificial layer 530 in the first and second narrow trenches, 1427 and 1527, are referred to as first and second sacrificial blocks, 530A and 530B, respectively. Thus the respective portions of the material layer 220 are exposed within the first holes 525 but not exposed with the first and second narrow trenches, 1427 and 1527.

Figure 19A:
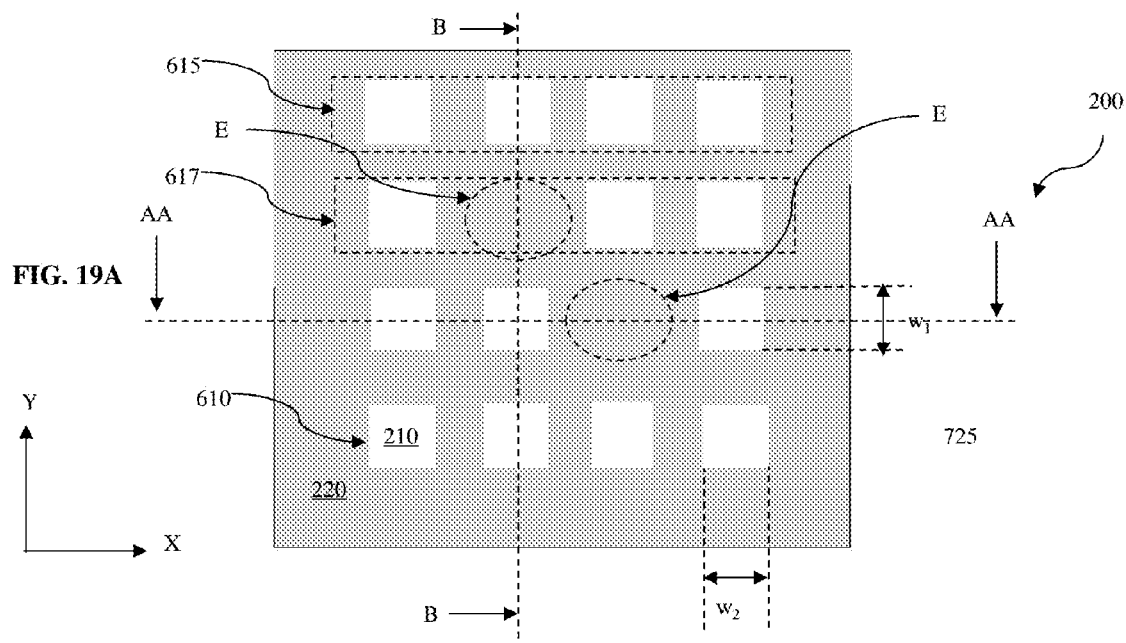
FIG. 19A is a top view of an example of a semiconductor device in accordance with some embodiments.
Figure 19B:
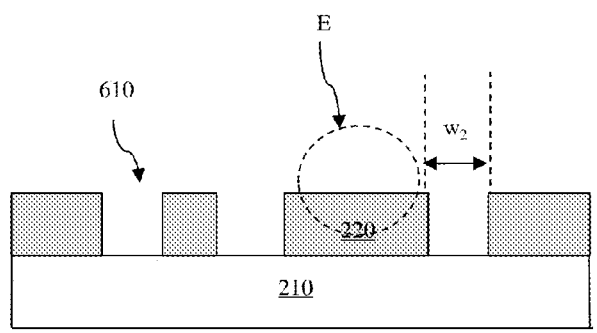
FIG. 19B is a cross-sectional view of an example semiconductor device in accordance with some embodiments, along the line AA-AA in FIG. 19A.
Figure 19C:
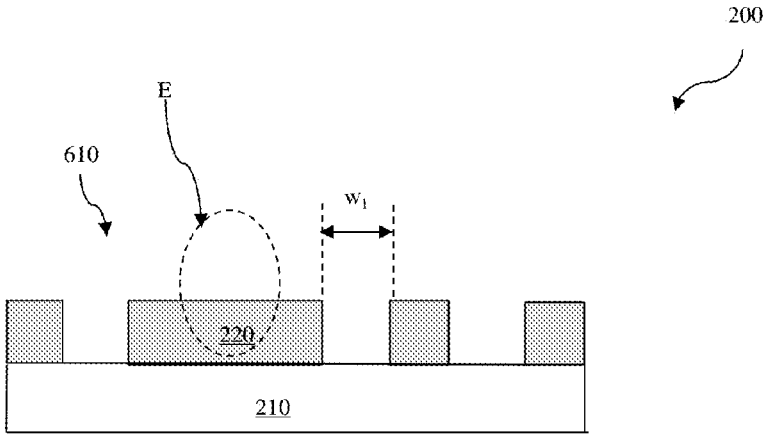
FIG. 19C is a cross-sectional view of an example semiconductor device in accordance with some embodiments, along the line B-B in FIG. 19A.

Referring to FIGS. 10 and 18A-18C, the method of 1000 proceeds to step 1016 by etching the material layer 220 through first rectangular-shape holes 525 to transfer first rectangular-shape holes 525 to second rectangular-shape holes 610 in the material layer 220. In the present embodiment, the etch process is properly chosen to selectively remove the material layer 220 but does not substantially etch the first HM layer 310, the first and second sacrificial block, 530A and 530B, and the substrate 210. Thus, in the locations C and D, the first and second sacrificial blocks, 530A and 530B, protect the material layer 220 underneath of them and therefore second rectangular-shape holes 610 are absent in the locations C and D, referring as to hole-absent regions E. The etch process may include an anisotropic dry etch, such as a plasma anisotropic etch. After forming the second rectangular-shape holes 610 in the material layer 220, the first HM layer 310 and the first and second sacrificial blocks, 350A and 350B then removed by other proper etch processes, as shown in FIGS. 19A-19C.

Referring again to FIG. 19A, in the present embodiment, two types of row of rectangular-shape holes 610 are formed in the material layer 220, a first row 615 and a second row 617. In the first row 615, the second rectangular-shape holes 610 align along the X-direction and are apart from each other by a space in a repeatable manner. In the second row 617, the second rectangular-shape holes 610 align along the X-direction and are apart each other by a space in a non-repeatable manner because of having the hole-absent regions E. In some embodiments, some of the hole-absent regions E are formed to occupy a space of one second rectangular-shape hole 610, while some the hole-absent regions E are formed to occupy a space of multiple of second rectangular-shape holes 610. Thus, a designable non-uniform density of the second rectangular-shape 610 in the material layer 220 is achieved.

Additional steps can be provided before, during, and after the methods of 100 and 1000. Some of the steps described can be replaced, eliminated, or moved around for additional embodiments of the methods 100 and 1000. Other alternatives or embodiments may present without departure from the spirit and scope of the present disclosure.

The semiconductor device 200 may undergo further CMOS or MOS technology processing to form various features and regions known in the art. For example, various contacts/vias and multilayers interconnect features (e.g., interlayer dielectrics) over the substrate 210, configured to connect the various features or structures of the semiconductor device 200.

Based on the above, it can be seen that the present disclosure provides methods of forming rectangular-shape holes in a material layer. The method employs multiple cycles of lithography/etches to form rectangular-shape holes through line opening patterns in the resist layer. The method also employs forming a line opening having different line widths in a hard mask layers and cooperating with a sacrificial layer to achieve a designable non-uniform density of rectangular-shape holes in the material layer. The method demonstrates reducing irregularities/distortions in forming hole type features. The method provides a feasible process to form non-uniform density of hole type features.

The present disclosure provides many different embodiments of fabricating a semiconductor device that provide one or more improvements over existing approaches. In one embodiment, a method for fabricating a semiconductor device includes forming a first hard mask (HM) layer over a material layer, forming a patterned second HM layer over the first HM layer. The patterned second HM layer has first trench extending along a first direction. The method also includes forming a patterned resist layer over the second HM layer. The patterned resist layer has a first line opening extending along a second direction, which is perpendicular to the first direction. The first line opening overlaps the first trench and exposes a portion of the second HM layer. The method also includes etching the first HM layer by using the patterned resist layer and the exposed portion of the second HM layer as an etch mask together to form a first hole feature in the first HM layer.

In another embodiment, a method includes forming a first hard mask (HM) layer over a material layer, forming a second HM layer over the first HM layer, which has a plurality of first trenches, parallel to each other, expend along a first direction. The method also includes forming a patterned resist layer having a first line opening over in the second HM layer. The first line opening extends along a second direction (which is perpendicular to the first direction), overlaps with respect to the plurality of the first trenches. Respective portions of the second HM layer are exposed within the first line opening. The first line opening has a first portion with a first width and a second portion with a second width, which is smaller than the first width. The method also includes etching the first HM layer by using the pattern resist layer and the exposed portions of the second HM layer together as an etching mask, such that etching the first HM layer through the first portion of the first line opening to form a plurality of first square-hole type features in the first HM layer and etching the first HM layer through the second portion of the first line opening to form a second trench in the first HM layer. The method also includes filling in the second trench with a sacrificial layer and, with the sacrificial layer filled in the second trench, etching the material layer through the first square-hole type features to form a plurality of second square-hole type features in the material layer.

In yet another embodiment, a device includes a first row of square-hole type features in a material layer. The square-hole type feature is along a first direction. A space between each of two square-hole type feature in a repeatable manner. The device also includes a second row of square-hole features in the material layer, which are parallel to the first row of square-hole type features. A space between each of two square-hole type features in a non-repeatable manner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first hard mask (HM) layer over a material layer;
forming a patterned second HM layer over the first HM layer, wherein the patterned second HM layer has a first trench extending along a first direction;
forming a patterned resist layer over the patterned second HM layer, wherein the patterned resist layer has a first line opening extending along a second direction, which is perpendicular to the first direction, the first line opening overlapping the first trench and exposing a portion of the patterned second HM layer, wherein the patterned resist layer further includes a second line opening that is parallel to the first line opening and overlaps the first trench, wherein the patterned second HM layer exposed within the second line opening defines a first opening having a first width and a second opening having a second width, which is smaller than the first width;
etching the first HM layer by using the patterned resist layer and the exposed portion of the patterned second HM layer as an etch mask together to form a first hole feature in the first HM layer, wherein etching the first HM layer by using the patterned resist layer and the exposed portion of the patterned second HM layer as the etch mask includes etching the first HM layer through the first opening to form a second hole feature in the first HM layer and etching the first HM layer through the second opening to form a second trench in the first HM layer;
depositing a sacrificial layer to fully fill in the second trench and partially fill in the first hole feature;
removing the sacrificial layer from the first hole feature while the sacrificial layer remains in the second trench; and
with the remaining sacrificial layer in the second trench, etching the material layer through the first hole feature to form a third hole feature.

2. The method of claim 1, wherein the first trench exposes the first HM layer.

3. The method of claim 1, further comprising etching the material layer through the second hole feature to form a fourth hole feature in the material layer.

4. The method of claim 3, further comprising removing the patterned second HM layer prior to etching the material layer.

5. The method of claim 1, wherein the first HM layer is etched by a selective etch, which does not substantially etch the exposed portions of the patterned second HM layer.

6. The method of claim 1, further comprising removing the first HM layer and the remaining sacrificial layer.

7. The method of claim 6, wherein a portion of the material layer underneath the remaining sacrificial layer remains intact during the etching of the material layer through the first hole feature to form the third hole feature.

8. A method comprising:
forming a first hard mask (HM) layer over a material layer;
forming a second HM layer over the first HM layer, wherein the second HM layer has a plurality of first trenches, parallel to each other, extending along a first direction;
forming a patterned resist layer having a first line opening over the second HM layer, wherein the first line opening extends along a second direction, which is perpendicular to the first direction, and overlaps with respect to the plurality of the first trenches, wherein respective portions of the second HM layer are exposed within the first line opening;
etching the first HM layer by using the pattern resist layer and the exposed respective portions of the second HM layer together as an etching mask to form a plurality of first square-hole type features in the first HM layer and a second trench in the first HM layer;
filling in the second trench with a sacrificial layer, wherein filling in the second trench with the sacrificial layer includes:
depositing the sacrificial layer to fully fill in the second trench and partially fill in the plurality of first square-hole type features; and
removing the sacrificial layer from the plurality of first square-hole type features; and
with the sacrificial layer filled in the second trench, etching the material layer through the plurality of first square-hole type features to form a plurality of second square-hole type features in the material layer.

9. The method of claim 8, wherein protected by the sacrificial layer in the second trench, a respective portion of the material layer underneath the sacrificial layer remain intact during etching the material layer, which forms a hole-feature-absent region in the material layer.

10. The method of claim 8, the sacrificial layer is removed by an isotropic etch.

11. The method of claim 8, wherein the first HM layer is etched by a selective etch, which does not substantially etch the exposed second HM layer within the first line opening of the patterned resist layer.

12. The method of claim 8, wherein the patterned resist layer further includes a second line opening parallel to the first line opening and overlapping with respect to the plurality of first trenches, wherein respective portions of the second HM layer are exposed within the second line opening.

13. The method of claim 12, wherein etching the first HM layer to form the second trench includes etching the first HM layer through the second line opening to form a plurality of third square-hole type features in the first HM layer; and
wherein etching the material layer through the plurality of first square-hole type features includes etching the material layer through the plurality of third square-hole type features to form a plurality of fourth square-hole type features in the material layer.

14. The method of claim 8, further comprising:
prior to the forming patterned resist layer over the second HM layer, forming a third trench in the second HM layer that is parallel to each of the plurality of the first trenches, the third trench having a third portion with a third width and a fourth portion with a fourth width, which is smaller than the third width.

15. The method of claim 14, further comprising:
etching the first HM layer through the fourth portion to form a fourth trench in the first HM layer;
filling in the fourth trench with the sacrificial layer; and
etching the material layer by using the first HM as an etching mask, wherein protected by the sacrificial layer in the fourth trench, a respective portion of the material layer underneath the sacrificial layer remain intact during etching the material layer, which forms another hole-feature-absent region in the material layer.

16. A method comprising:
forming a first hard mask (HM) layer over a material layer;
forming a patterned second HM layer over the first HM layer, wherein the patterned second HM layer defines a first trench extending along a first direction;
forming a patterned material layer over the patterned second HM layer, wherein the patterned material layer has a first line opening extending along a second direction, which is perpendicular to the first direction, the first line opening overlapping the first trench and exposing a portion of the patterned second HM layer, wherein the patterned material layer further includes a second line opening that overlaps the first trench; and
etching the first HM layer by using the patterned material layer and the exposed portion of the patterned second HM layer as an etch mask together to form a first hole feature in the first HM layer, wherein etching the first HM layer by using the patterned material layer and the exposed portion of the patterned second HM layer as the etch mask includes etching the first HM layer through a first opening to form a second hole feature in the first HM layer and etching the first HM layer through a second opening to form a second trench in the first HM layer;
forming a sacrificial layer in the first hole feature and the second trench such that the first hole feature is partially filled with the sacrificial layer and the second trench is fully filled with the sacrificial layer;
removing the sacrificial layer from the first hole feature while the sacrificial layer remains in the second trench; and
etching the material layer through the first hole feature to form a third hole feature while the sacrificial layer remains in the second trench.

17. The method of claim 16, wherein the patterned second HM layer exposed within the second line opening defines the first opening having a first width and the second opening having a second width that is different than the first width.

18. The method of claim 16, wherein the patterned second HM layer is formed of a different material than the first HM layer.

19. The method of claim 16, further comprising removing the sacrificial layer from the second trench.

* * * * *